United States Patent
Ichige et al.

(10) Patent No.: US 8,637,915 B2
(45) Date of Patent: Jan. 28, 2014

(54) NONVOLATILE SEMICONDUCTOR MEMORY

(75) Inventors: Masayuki Ichige, Yokkaichi (JP); Fumitaka Arai, Yokohama (JP); Riichiro Shirota, Fujisawa (JP); Toshitake Yaegashi, Yokohama (JP); Yoshio Ozawa, Yokohama (JP); Akihito Yamamoto, Naka-gun (JP); Ichiro Mizushima, Yokohama (JP); Yoshihiko Saito, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 13/007,258

(22) Filed: Jan. 14, 2011

(65) Prior Publication Data

US 2011/0108905 A1    May 12, 2011

Related U.S. Application Data

(63) Continuation of application No. 11/687,758, filed on Mar. 19, 2007, now Pat. No. 7,982,259.

(30) Foreign Application Priority Data

Apr. 24, 2006    (JP) .................... 2006-119416

(51) Int. Cl.
   *H01L 29/788*    (2006.01)
(52) U.S. Cl.
   USPC .................................. 257/316; 257/E27.103
(58) Field of Classification Search
   USPC .......................................... 257/316, E27.103
   See application file for complete search history.

(56) References Cited

U.S. PATENT DOCUMENTS

| | | | |
|---|---|---|---|
| 2004/0104422 A1* | 6/2004 | Arai et al. | 257/315 |
| 2005/0207226 A1* | 9/2005 | Yuan | 365/185.17 |
| 2005/0212034 A1* | 9/2005 | Sasago et al. | 257/315 |
| 2006/0060913 A1 | 3/2006 | Ozawa | |
| 2006/0131635 A1 | 6/2006 | Lai et al. | |

(Continued)

FOREIGN PATENT DOCUMENTS

| | | |
|---|---|---|
| JP | 2003-23115 A | 1/2003 |
| JP | 2004-22819 | 1/2004 |

(Continued)

OTHER PUBLICATIONS

U.S. Appl. No. 13/194,131, filed Jul. 29, 2011, Sakamoto, et al.
Japanese Office Action issued on Feb. 1, 2011 in corresponding Japanese Application No. 2006-119416 (with an English Translation).

*Primary Examiner* — Matthew Landau
*Assistant Examiner* — Igwe U Anya
(74) *Attorney, Agent, or Firm* — Oblon, Spivak, McClelland, Maier & Neustadt, L.L.P.

(57) ABSTRACT

A nonvolatile semiconductor memory includes first and second memory cells having a floating gate and a control gate. The floating gate of the first and second memory cells is comprised a first part, and a second part arranged on the first part, and a width of the second part in an extending direction of the control gate is narrower than that of the first part. A first space between the first parts of the first and second memory cells is filled with one kind of an insulator. The control gate is arranged at a second space between the second parts of the first and second memory cells.

20 Claims, 20 Drawing Sheets

(56) References Cited

U.S. PATENT DOCUMENTS

| | | |
|---|---|---|
| 2006/0281244 A1 | 12/2006 | Ichige et al. |
| 2006/0292802 A1* | 12/2006 | Lee et al. ............... 438/264 |
| 2007/0047304 A1 | 3/2007 | Lee et al. |
| 2007/0076485 A1* | 4/2007 | Lutze et al. ............ 365/185.22 |
| 2007/0111441 A1 | 5/2007 | Koh et al. |
| 2008/0035983 A1* | 2/2008 | Sandhu et al. ............ 257/316 |
| 2008/0074920 A1 | 3/2008 | Chien et al. |
| 2008/0105916 A1 | 5/2008 | Watanabe |
| 2008/0149987 A1 | 6/2008 | Alapati et al. |

FOREIGN PATENT DOCUMENTS

| | | |
|---|---|---|
| JP | 2004-214510 A | 7/2004 |
| JP | 2005-277035 A | 10/2005 |
| JP | 2006-93327 A | 4/2006 |
| JP | 2006-344746 A | 12/2006 |
| JP | 2007-36260 A | 2/2007 |

\* cited by examiner

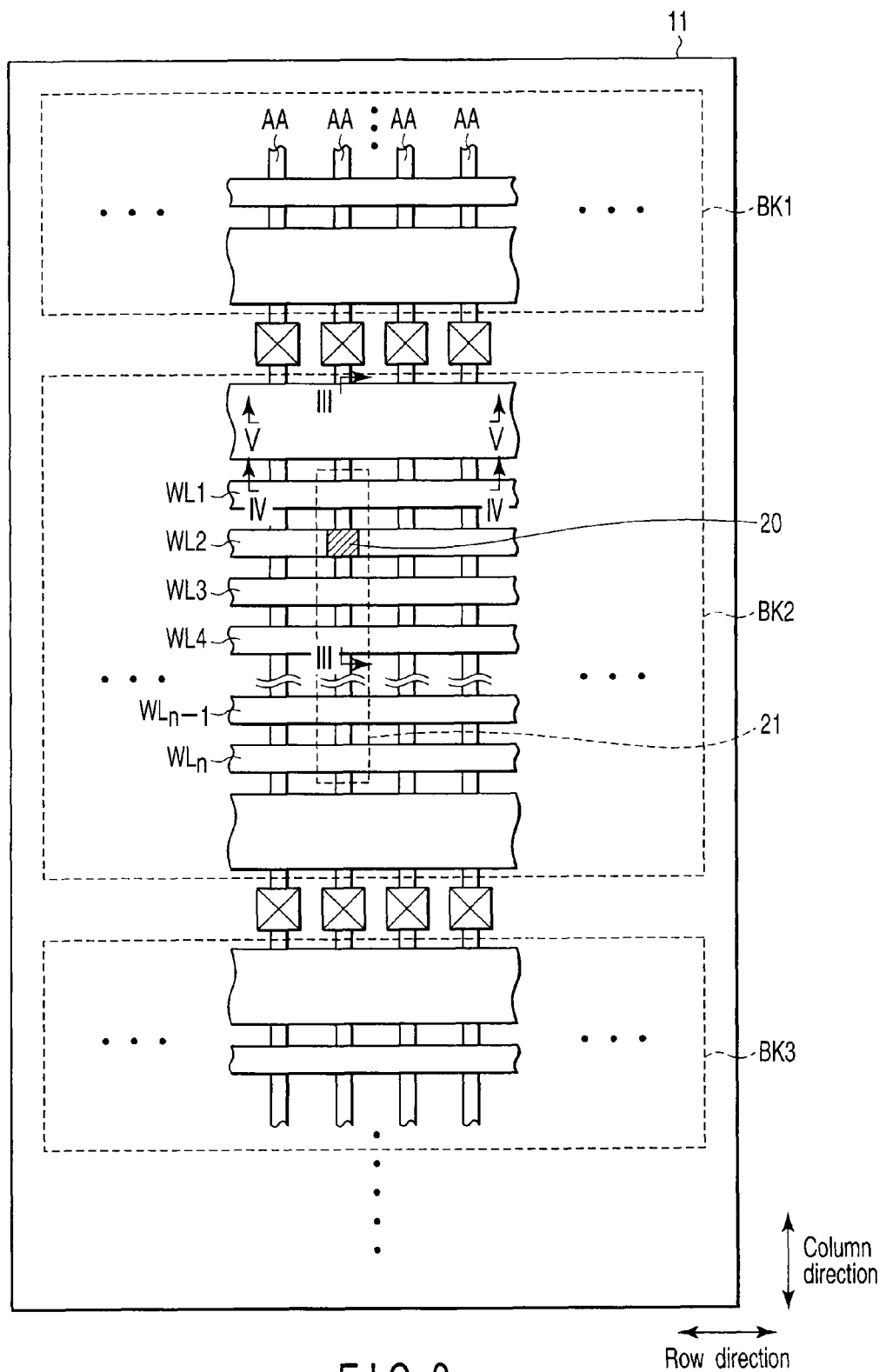
F I G. 2

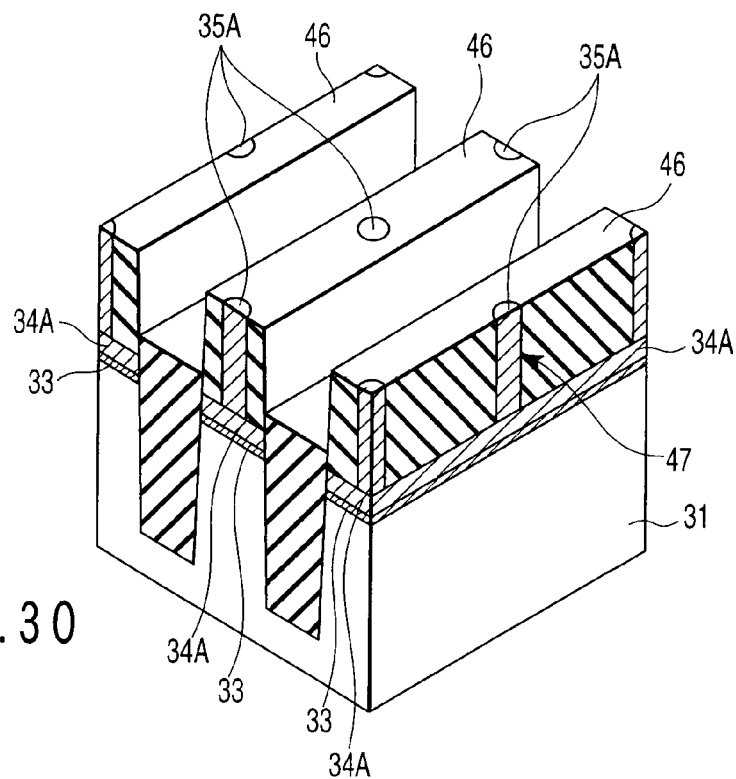
F I G. 30
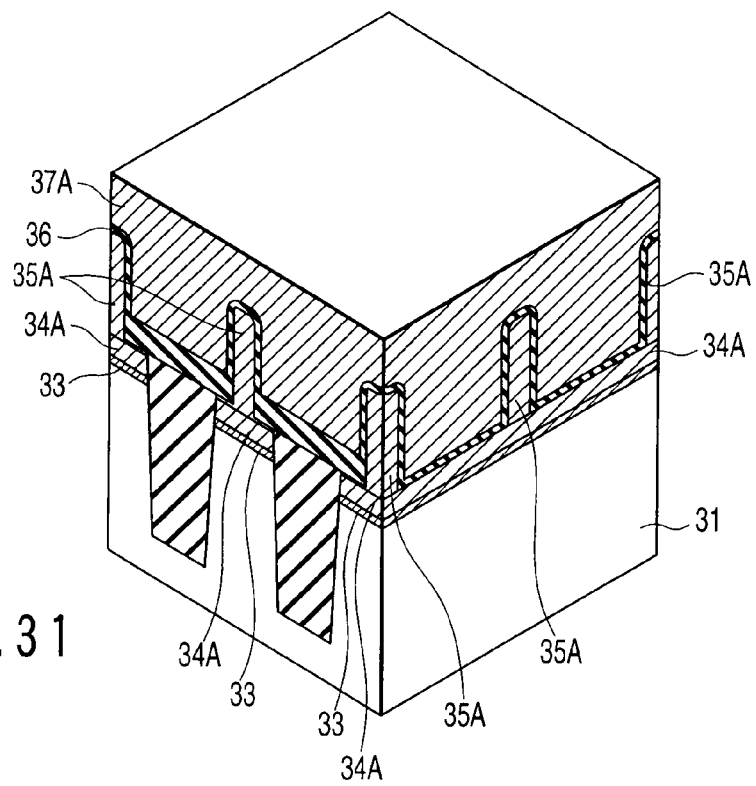
F I G. 31

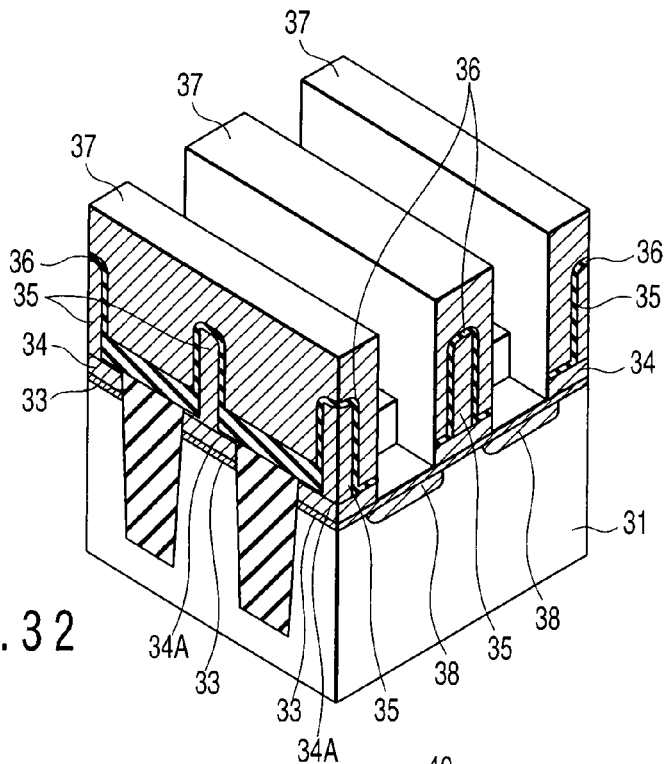
F I G. 3 2
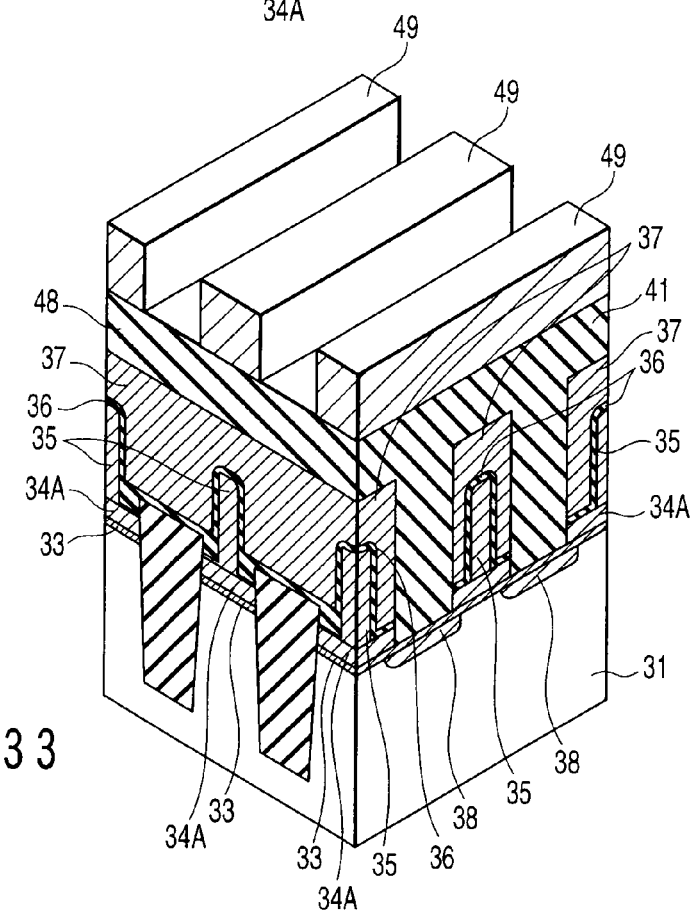
F I G. 3 3

NONVOLATILE SEMICONDUCTOR MEMORY

CROSS-REFERENCE TO RELATED APPLICATIONS

This application is a continuation of U.S. application Ser. No. 11/687,758 filed Mar. 19, 2007, and is based upon and claims the benefit of priority from prior Japanese Patent Application No. 2006-119416, filed Apr. 24, 2006, the entire contents of each of which are incorporated herein by reference.

BACKGROUND OF THE INVENTION

1. Field of the Invention

The present invention relates to a memory cell structure of a nonvolatile semiconductor memory.

2. Description of the Related Art

In a nonvolatile semiconductor memory provided with a memory cell of a stack gate structure having a floating gate and a control gate, such as a NAND-type flash memory, memory capacity in every generation can be increased by reducing the size of the memory cell in accordance with a scaling rule.

However, when reducing the size of the memory cell, since a parasitic capacitance between adjacent cells increases and a coupling ratio is reduced, other means for maintaining or improving the coupling ratio should be considered.

One of the means is a method in which areas of the floating gate and the control gate face with each other are made to increase by a three-dimensional cell structure to maintain a capacitance coupling ratio.

For instance, a structure in which the floating gate is made to have a vertical long shape (column shape, protrusion shape or the like) to a surface of a semiconductor substrate is a promising candidate of the memory cell structure of a next generation as the structure capable of improving the coupling ratio without enlarging a size of the memory cell (for instance, refer to patent documents, Jpn. Pat Appln. KOKAI Publication No. 2004-22819, U.S. Pat. No. 6,908,817).

A drawback of this structure exists in a point that the floating gates of the adjacent two memory cells increase simultaneously together with areas faced with each other, thus deterioration of the cell characteristics caused by threshold fluctuation is generated by an interference effect between cells.

This deterioration of the cell characteristics exerts a significant influence on the NAND-type flash memory to which a multilevel cell (MLC) technique is applied and which the MLC technique necessitates delicate threshold control.

BRIEF SUMMARY OF THE INVENTION

A nonvolatile semiconductor memory according to an aspect of the present invention is provided with first and second memory cells of a stack gate structure having a floating gate and a control gate, wherein each of the floating gates of the first and second memory cells is comprised a first part and a second part arranged on the first part and width of which in an extending direction of the control gate is narrower than that of the first part. The first part is arranged between stripe shaped element isolation insulating layers. An upper surface of the element isolation insulating layer exists on the same position in height as the upper surface of the first part or on a position lower than that. A first space between the first parts of the first and second memory cells is filled with one kind of an insulator. The control gate is arranged at a second space between the second parts of the first and second memory cells via a dielectric material having a dielectric constant higher than that of the one kind of the insulator.

BRIEF DESCRIPTION OF THE SEVERAL VIEWS OF THE DRAWING

FIG. 2 is a plan view showing layout as a reference example;

FIG. 30 is a perspective view showing one process of a manufacturing method according to the example of the present invention;

FIG. 31 is a perspective view showing one process of a manufacturing method according to the example of the present invention;

FIG. 32 is a perspective view showing one process of a manufacturing method according to the example of the present invention; and FIG. 33 is a perspective view showing one process of a manufacturing method according to the example of the present invention.

DETAILED DESCRIPTION OF THE INVENTION

A nonvolatile semiconductor memory of an aspect of the present invention will be described below in detail with reference to the accompanying drawings.

1. OUTLINE

An example of the present invention has characteristics in that, with two memory cells having a protruding shaped floating gate as objects, a region where the floating gates of the both memory cells are formed in closest proximity with each other is filled with one kind of insulator having a low dielectric constant, while a dielectric material having a higher dielectric constant is arranged in other regions.

A parasitic capacitance (interference between cells) generated between two memory cells is minimized and deterioration of cell characteristics caused by threshold fluctuation of the memory cell is prevented by the insulator having a low dielectric constant. Further, the dielectric material with a high dielectric constant increases the capacitance of the floating gate and the control gate to improve a coupling ratio.

Here, in the case where a protruding shaped lower part is defined as a first part, and a protruding shaped upper part is defined as a second part, a region where the floating gates of the two memory cells exist in closest proximity with each other results in a first space between the first parts of the floating gates, while other region results in a second space between the second parts.

Further, one kind of insulator means that the insulator is made of the same material, and slight differences in film quality caused by the fact that manufacturing time or manufacturing method differs are included in the one kind of insulator.

2. EMBODIMENTS

There will be described embodiments with a NAND-type flash memory as an example.

(1) Overall View

Figure 1:
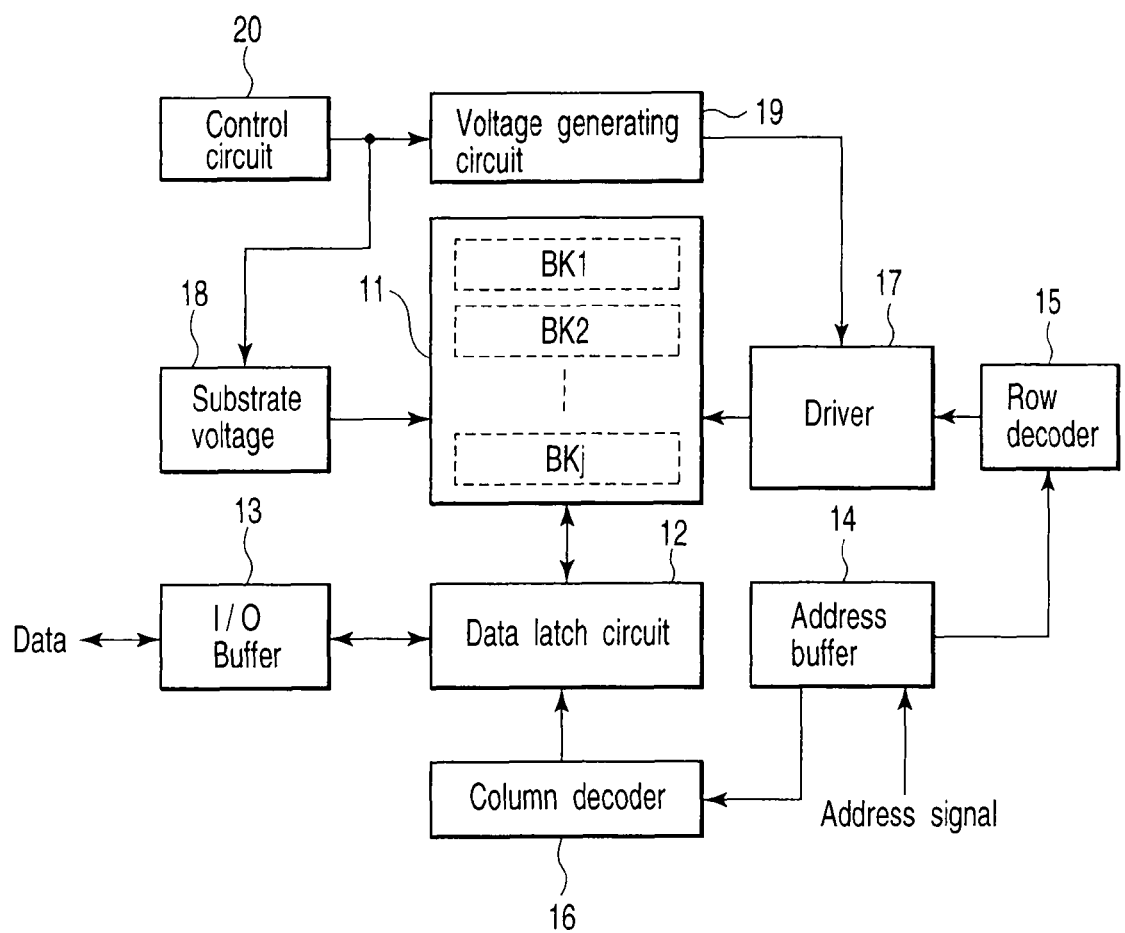
FIG. 1 is a block diagram showing a main part of a NAND-type flash memory.

FIG. 1 shows the overall view of a NAND-type flash memory.

A memory cell array 11 is comprised a plurality of blocks BK1, BK2, . . . BLj. Each of the plurality of blocks BK1, BK2, . . . BLj has a plurality of cell units, and each of the plurality of cell units is comprised a NAND string comprised a plurality of memory cells connected serially and two select gate transistors each of which is connected to each end of the NAND string.

A data latch circuit 12 has a function to latch data temporarily at the time of read/write, and for instance, is comprised a flip-flop circuit. An input/output (I/O) buffer 13 functions as an interface circuit of the data, and an address buffer 14 functions as an interface circuit of an address signal.

A row decoder 15 and a column decoder 16 select the memory cell within the memory cell array 11 based on the address signal. A word line driver 17 drives a word line selected within the selected block.

A substrate voltage control circuit 18 controls voltage of a semiconductor substrate. Specifically, a double well region comprised an n-type well region and a p-type well region is formed within a p-type semiconductor substrate, and when the memory cell is formed within the p-type well region, voltage of the p-type well region is controlled in accordance with an operation mode.

For instance, the substrate voltage control circuit 18 sets the p-type well region to 0 V at the time of read/write, and sets the p-type well region to voltage of 15 V or more and 40 V or less at the time of erase.

A voltage generating circuit 19 generates a voltage supplied to word lines within selected blocks.

For instance, at the time of read, the voltage generating circuit 19 generates a read voltage and an intermediate voltage. The read voltage is supplied to the selected word line within the selected block, and the intermediate voltage is supplied to a non selected word line within the selected block.

Further, at the time of write, the voltage generating circuit 19 generates a write voltage and an intermediate voltage. The write voltage is supplied to the selected word line within the selected block, and the intermediate voltage is supplied to the non selected word line within the selected block.

A control circuit 20 controls operation of, for instance, the substrate voltage control circuit 18 and the voltage generating circuit 19.

(2) Reference Example

First, there will be explained the reference example.

Figure 3:
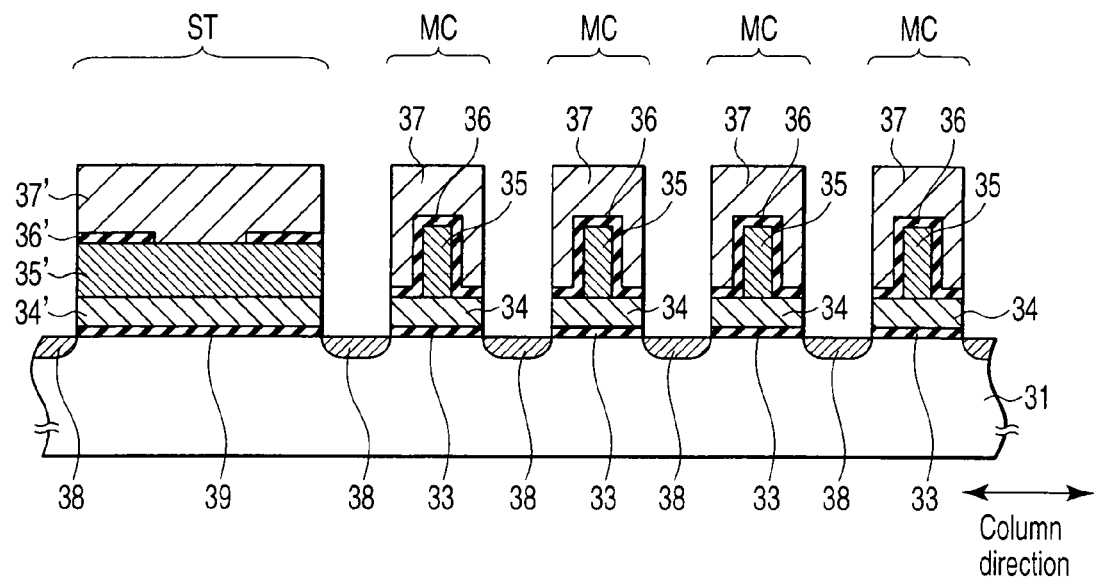
FIG. 3 is a cross-sectional view along a line III-III of FIG. 2.
Figure 4:
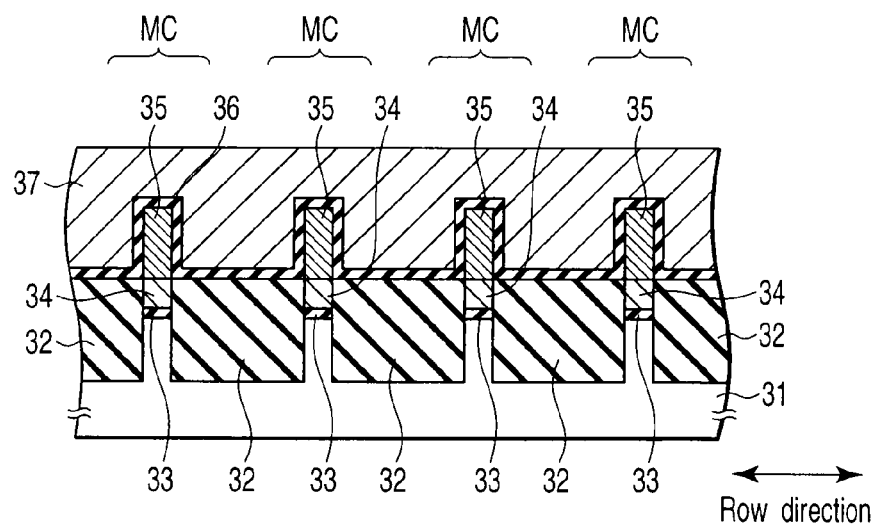
FIG. 4 is a cross-sectional view along a line IV-IV of FIG. 2.
Figure 5:
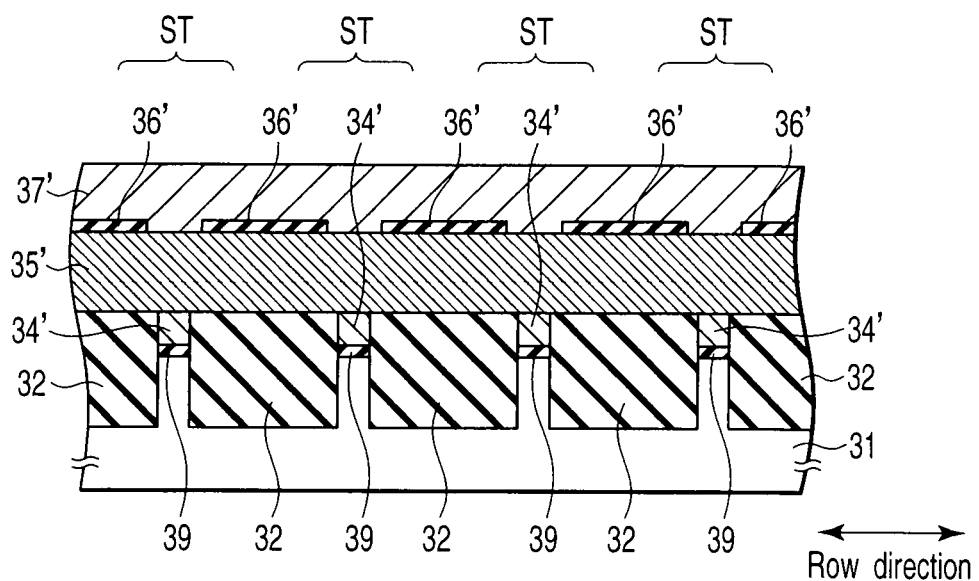
FIG. 5 is a cross-sectional view along a line V-V of FIG. 2.

FIG. 2 shows layout of a memory cell array of the NAND-type flash memory according to the reference example. FIG. 3 shows a cross section along a line III-III of FIG. 2, FIG. 4 shows a cross section along a line IV-IV of FIG. 2, and FIG. 5 shows a cross section along a line V-V of FIG. 2.

In these drawings, in order to facilitate the explanation, an insulating layer and a conductive layer (bit lines, metallic lines or the like) are omitted at upper part than the control gate.

The memory cell array 11 corresponding to the memory cell array 11 of FIG. 1 is comprised a plurality of blocks BK1, BK2, BK3, . . . .

Each of the blocks has a plurality of cell units arranged in a row direction. Each of the plurality of cell units is comprised a NAND string 21 comprised a plurality of memory cells connected serially, and two select gate transistors each of which is connected to each end of the NAND string.

An element isolation insulating layer 32 with STI (shallow trench isolation) structure is arranged within a semiconductor substrate 31. The element isolation insulating layer 32 is formed in stripe shape long in the column direction, and region therebetween becomes an active area AA. The cell unit is arranged in the active area AA.

The memory cell MC is comprised a source/drain diffusion layer 38 formed on a surface region of the semiconductor substrate 31, floating gates 34, 35 arranged via a tunnel oxide film 33 on the channel region between the source/drain diffusion layers 38, and a control gate 37 arranged via an inter-poly dielectric (IPD) layer 36 on the floating gates 34, 35.

A select gate transistor ST is comprised the source/drain diffusion layer 38 formed on a surface region of the semiconductor substrate 31, and gate electrodes 34', 35', and 37' arranged via a gate oxide film 39 on a channel region between the source/drain diffusion layers 38.

The gate electrodes 34', 35' are formed of the same material as the floating gates 34, 35, such as for instance, conductive polysilicon, and the gate electrode 37' is formed of the same material as the control gate 37, such as for instance, a stack structure of conductive polysilicon and silicide. The insulating layer 36' has the same structure as the IPD layer 36, such as for instance, an oxide-nitride-oxide (ONO) structure.

Here, the floating gate 34 is arranged at a space between the element isolation insulating layers 32. As shown in FIG. 3, the floating gate 35 is arranged on the floating gate 34, and width of the floating gate 35 in the extending direction (column direction) of the NAND string 21 is narrower than that of the floating gate 34.

As a result, cross section in the column direction of the floating gates 34, 35 becomes protrusion as a whole, and miniaturization of the memory cell MC and increase of the coupling ratio can be compatibly achieved.

On the other hand, as shown in FIG. 4, the width of the floating gate 35 in the extending direction (row direction) of the control gate 37 is the same as that of the floating gate 34.

In this case, by widening width of the element isolation insulating layer 32, it is possible to minimize the parasitic capacitance (interference between cells) generated between the floating gates 34, 35 of the two memory cells MC, and to prevent deterioration of the cell characteristics caused by the threshold fluctuation of the memory cell without lowering the coupling ratio.

However, when an area of the memory cell array 11 is constant, to widen the width of the element isolation insulating layer 32 means to make the width of the active area AA narrow. When the width of the active area becomes narrow, a channel width of the memory cell MC becomes narrow. As a result, a current driving power of the memory cell MC decreases.

Accordingly, for instance, in FIG. 4, it is also possible to make the width of the floating gate 35 in the extending direction (row direction) of the control gate 37 narrower than that of the floating gate 34 by using the technique disclosed in the patent document 1.

Figure 6:
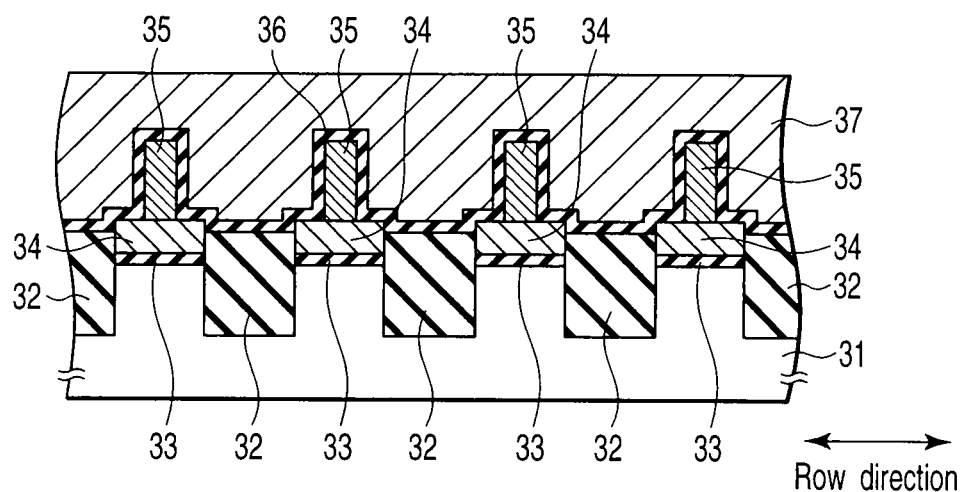
FIG. 6 is a cross-sectional view showing a NAND string of the reference example.

In this case, as shown in FIG. 6, the cross sections in the row direction of the floating gates 34, 35 become protrusions as a whole.

However, as apparent from FIG. 6, to make the cross sections in the row direction of the floating gates 34, 35 protrusion means that the width of the element isolation insulating layer 32 is made narrow. That is, concerning two memory cells MC adjacent to each other, lower part of the protrusion, that is, a space between the floating gates 34 becomes narrow. As a result, the parasitic capacitance of both memory cells MC increases, degrading the cell characteristics.

This becomes remarkable when, in particular, using the stack structure formed with a high dielectric material (for instance, silicon nitride) having a higher dielectric constant than silicon oxide or a plurality of materials including the high-dielectric material for the IPD layer 36.

That is, generally, in the manufacturing process, an upper surface of the element isolation insulating layer 32 becomes lower than an upper surface of the floating gate 34. Therefore, when the dielectric material is arranged at the region (between the floating gates 34) where the floating gates 34, 35 are formed in closest proximity with each other, thus the interference effect between cells is accelerated.

(3) First Embodiment

Figure 7:
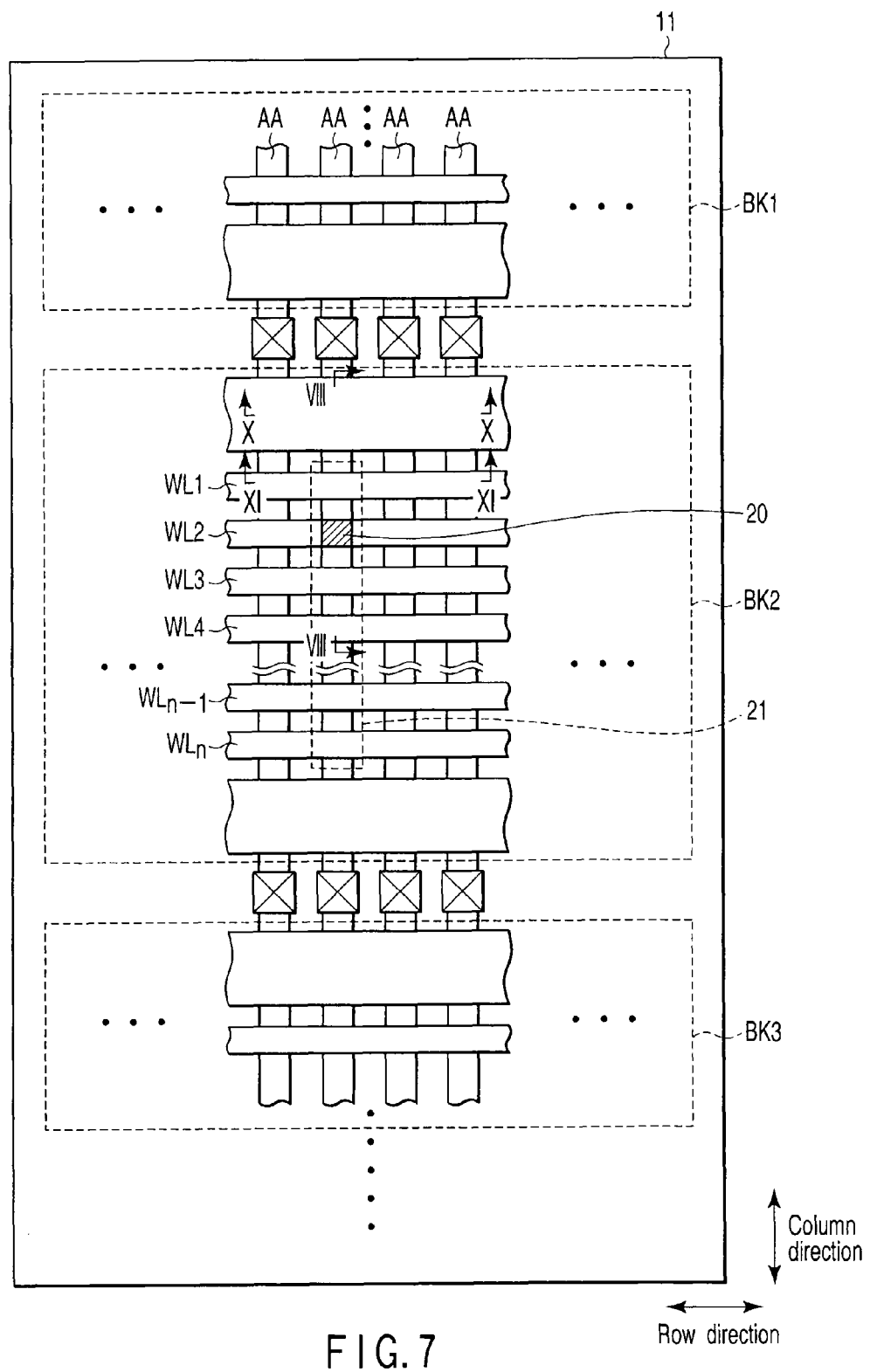
FIG. 7 is a plan view showing layout as a first embodiment.
Figure 8:
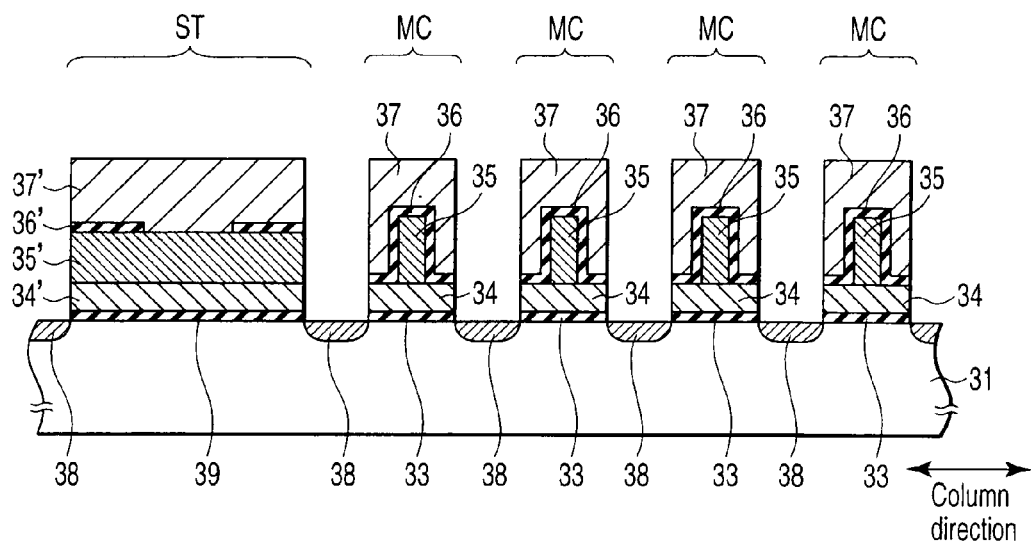
FIG. 8 is a cross-sectional view along a line VIII-VIII of FIG. 7.
Figure 9:
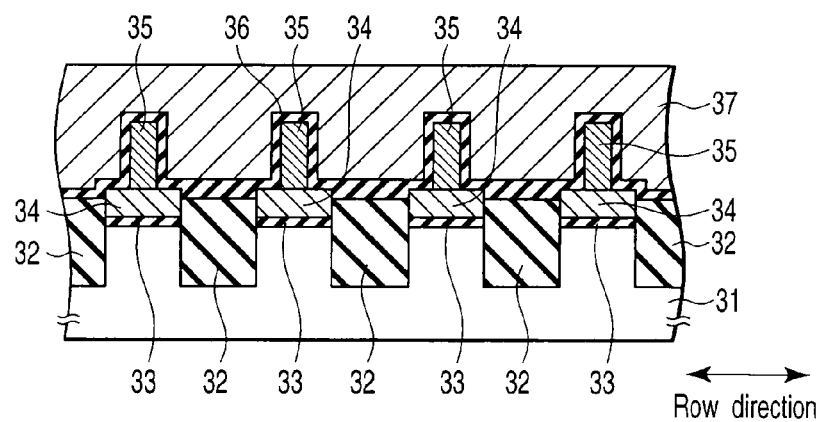
FIG. 9 is a cross-sectional view along a line IX-IX of FIG. 7.
Figure 10:
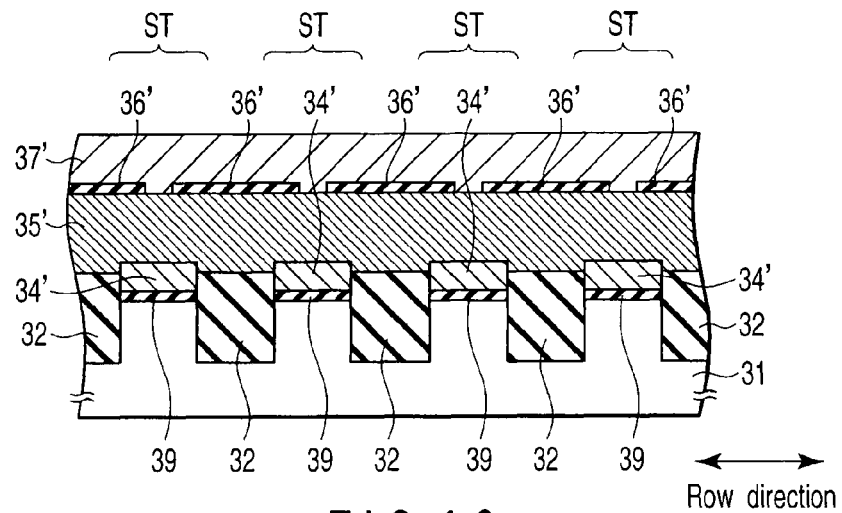
FIG. 10 is a cross-sectional view along a line X-X of FIG. 7.

FIG. 7 shows layout of a memory cell array of a NAND-type flash memory according to a first embodiment. FIG. 8 shows a cross section along a line VIII-VIII of FIG. 7, FIG. 9 shows a cross section along a line IX-IX of FIG. 7, and FIG. 10 shows a cross section along a line X-X of FIG. 7.

In these drawings, in order to facilitate the explanation, an insulating layer and a conductive layer (bit lines, metallic lines or the like) are omitted at upper part than the control gate.

A memory cell array 11 corresponding to the memory cell array 11 of FIG. 1 is comprised a plurality of blocks BK1, BK2, BK3, . . . .

Each of the blocks has a plurality of cell units arranged in a row direction. Each of the plurality of cell units is comprised a NAND string 21 comprised a plurality of memory cells connected serially, and two select gate transistors each of which is connected to each end of the NAND string.

An element isolation insulating layer 32 with an STI structure is arranged within a semiconductor substrate 31. The element isolation insulating layer 32 is formed in a stripe shape long in the column direction, and region therebetween becomes an active area AA. The cell unit is arranged in the active area AA.

The memory cell MC is comprised a source/drain diffusion layer 38 formed on a surface region of the semiconductor substrate 31, floating gates 34, 35 arranged via a tunnel oxide film 33 on the channel region between the source/drain diffusion layers 38, and a control gate 37 arranged via an IPD layer 36 on the floating gates 34, 35.

A select gate transistor ST is comprised a source/drain diffusion layer 38 formed on a surface region of the semiconductor substrate 31, and gate electrodes 34', 35', and 37' arranged via a gate oxide film 39 on a channel region between the source/drain diffusion layers 38.

The gate electrodes 34', 35' are formed of the same material as the floating gates 34, 35, such as for instance, conductive polysilicon, and the gate electrode 37' is formed of the same material as the control gate 37, such as for instance, a stack structure of conductive polysilicon and silicide. The insulating layer 36' has the same structure as the IPD layer 36, such as for instance, an ONO structure.

In the first embodiment, the floating gate 34 is arranged at a space between the element isolation insulating layers 32. The floating gate 35 is arranged on the floating gate 34, and widths of the floating gate 35 in the column direction and in the row direction are narrower than those of the floating gate 34.

Here, the first embodiment is different from the reference example in that concerning the both directions, the column direction and the row direction, respective widths of the floating gate 35 are narrower than those of the floating gate 34. In other words, the widths in all directions of the floating gate 35 are narrower than the widths in all directions of the floating gate 34.

As a result, the cross sections in the column direction and in the row direction of the floating gates 34, 35 become respective protrusions, and compared with the reference example, it is possible to achieve further miniaturization of the memory cell and increase of the coupling ratio.

Further, in the first embodiment, an upper surface of the element isolation insulating layer 32 exists at a lower position than an upper surface of the floating gate 34. As a result, the IPD layer 36 is also arranged between the floating gates 34 of the two memory cells MC adjacent to each other.

However, the first embodiment is different from the reference example in that, in the first embodiment, in order to minimize the parasitic capacitance (interference between cells) generated between the floating gates 34, the space between the floating gates 34 is filled with one kind of insulating material.

One kind of the insulating material means, as defined in the outline, that the same material is used. Therefore, in the present example, because the element isolation insulating layer 32 and the IPD layer 36 are arranged between the floating gates 34, it is necessary for at least the IPD layer 36 to include the same material as the material constituting the element isolation insulating layer 32.

For instance, when the element isolation insulating layer 32 is comprised material of silicon oxide ($SiO_2$), the IPD layer 36 has a structure including silicon oxide such as the ONO structure and an ONON structure.

Figure 11:
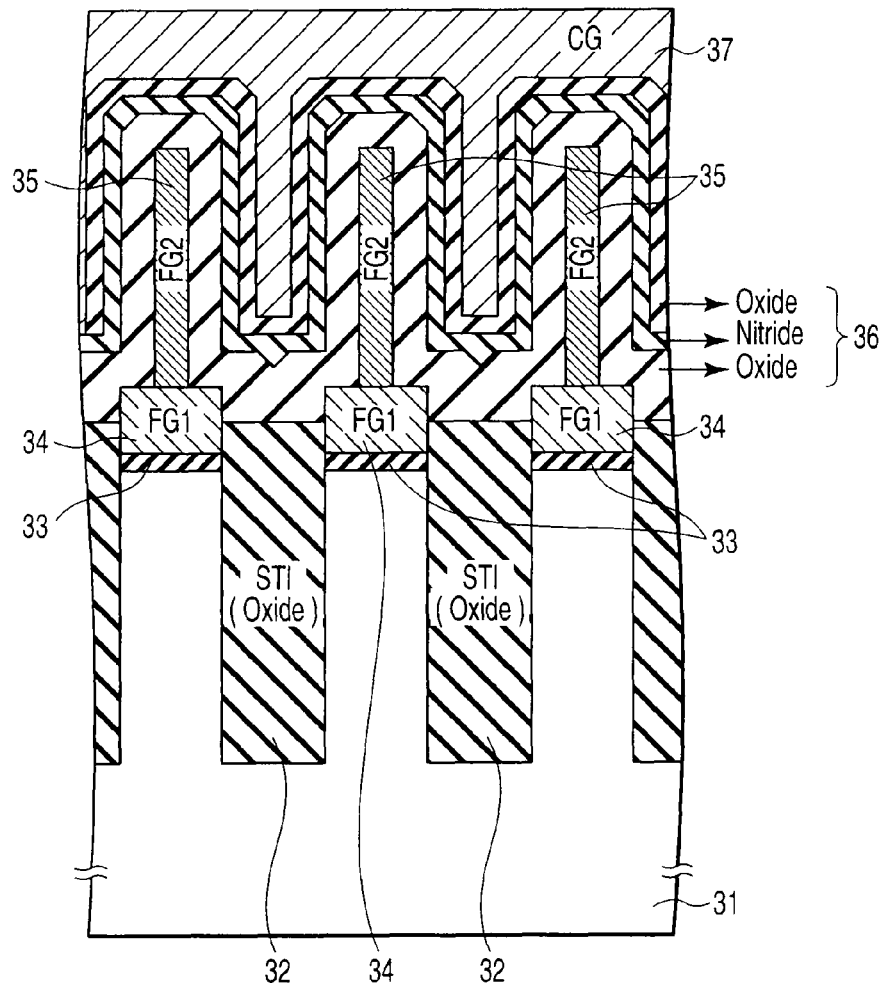
FIG. 11 is a cross-sectional view showing the NAND string of the first embodiment.

Then, for instance, as shown in FIG. 11, an important point is that a space between the floating gates 34 is filled with silicon oxide in a self-alignment manner.

Further, the control gate 37 is arranged at a space between the floating gates 35 via the dielectric material having higher dielectric constant than the dielectric constant of the one kind of insulator between the floating gates 34.

This dielectric material is, for instance, silicon nitride when the IPD layer 36 has the ONO structure or the ONON structure.

Thus, the floating gates 34, 35 are made to have protrusion, a region where the floating gates 34, 35 are formed in closest proximity with each other is filled with one kind of insulator having a low dielectric constant, and the dielectric material having a high dielectric constant is arranged at another region. As a result, even though the memory cell MC is miniaturized, there is no threshold fluctuation caused by the interference effect between the cells, thus it is possible to improve the coupling ratio.

(4) Second Embodiment

Figure 12:
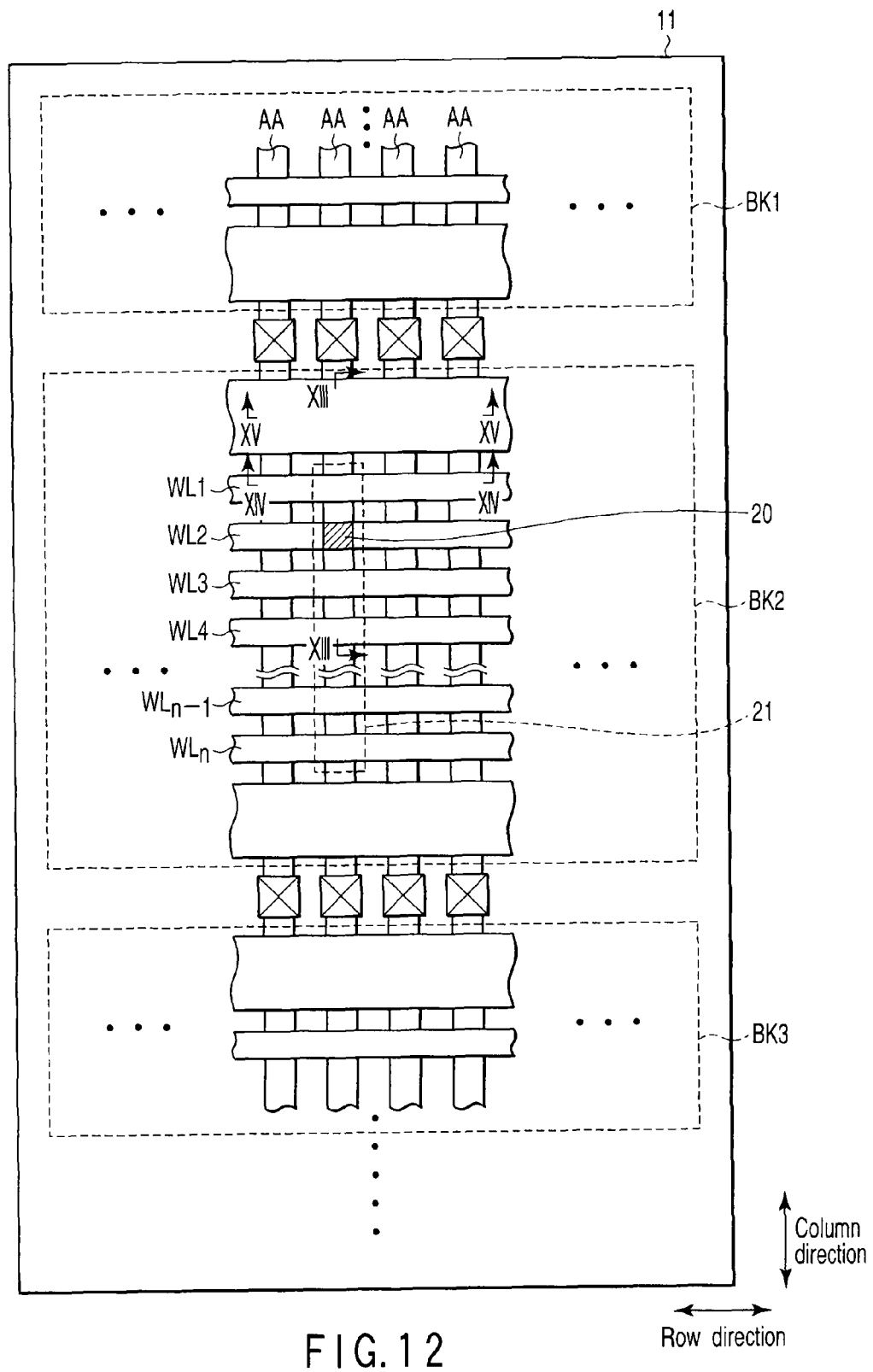
FIG. 12 is a plan view showing layout as a second embodiment.
Figure 13:
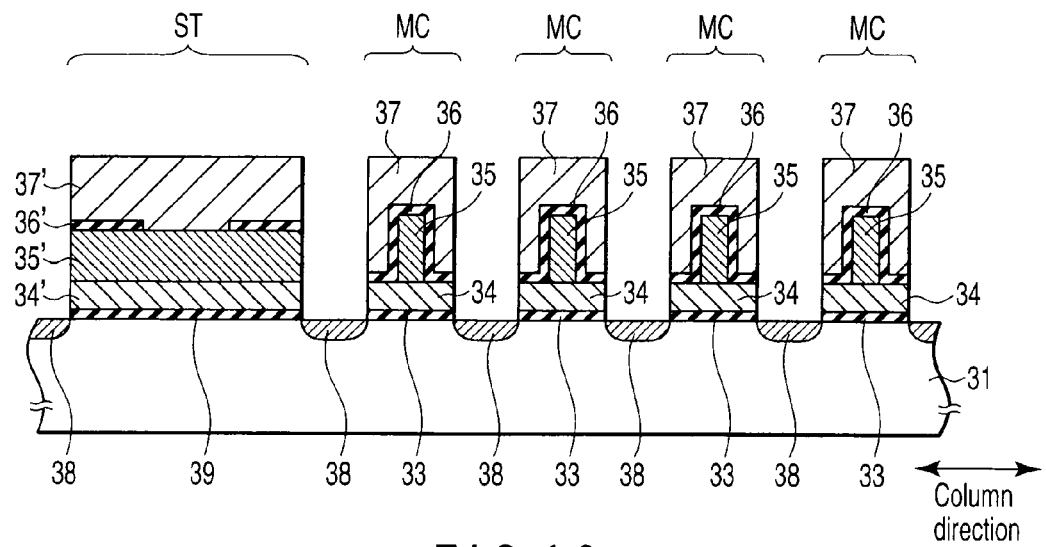
FIG. 13 is a cross-sectional view along a line XIII-XIII of FIG. 12.
Figure 14:
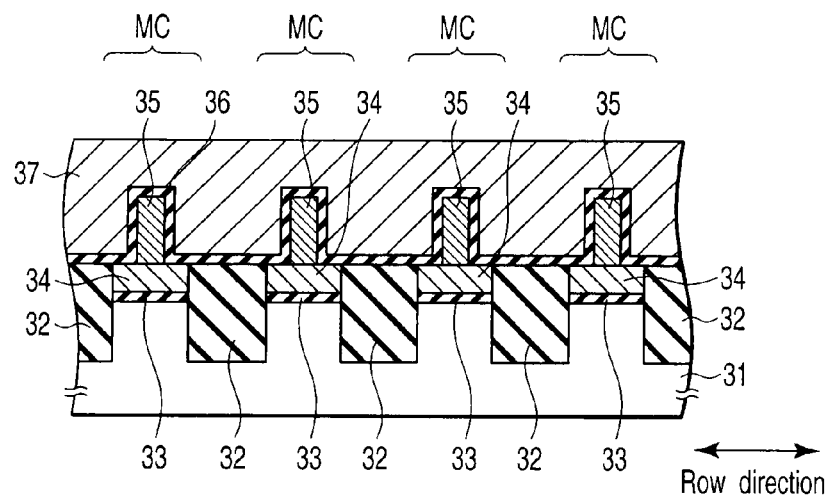
FIG. 14 is a cross-sectional view along a line XIV-XIV of FIG. 12.
Figure 15:
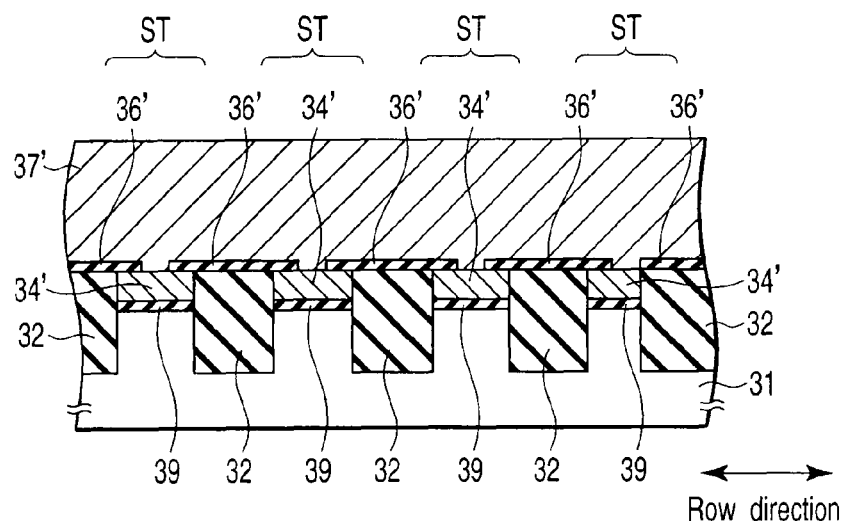
FIG. 15 is a cross-sectional view along a line XV-XV of FIG. 12.

FIG. 12 shows layout of a memory cell array of a NAND-type flash memory according to a second embodiment. FIG. 13 shows a cross section along a line XIII-XIII of FIG. 12, FIG. 14 shows a cross section along a line XIV-XIV of FIG. 12, and FIG. 15 shows a cross section along a line XV-XV of FIG. 12.

In these drawings, like the first embodiment, omitted are the insulating layer and the conductive layer upper than the control gate. Further, explanation of the structure of the memory cell 11 is omitted because it is the same as that of the first embodiment.

An element isolation insulating layer 32 with an STI structure is arranged within a semiconductor substrate 31. The element isolation insulating layer 32 is formed in a stripe shape long in the column direction, and a region therebetween becomes an active area AA. The cell unit is arranged in the active area AA.

The memory cell MC is comprised a source/drain diffusion layer 38 formed on a surface region of the semiconductor substrate 31, floating gates 34, 35 arranged via a tunnel oxide film 33 on the channel region between the source/drain diffusion layers 38, and a control gate 37 arranged via an IPD layer 36 on the floating gates 34, 35.

A select gate transistor ST is comprised a source/drain diffusion layer 38 formed on a surface region of the semiconductor substrate 31, and gate electrodes 34', 35', and 37' arranged via a gate oxide film 39 on a channel region between the source/drain diffusion layers 38.

The gate electrodes 34', 35' are formed of the same material as the floating gates 34, 35, such as for instance, conductive polysilicon, and the gate electrode 37' is formed of the same material as the control gate 37, such as for instance, a stack structure of conductive polysilicon and silicide. An insulating layer 36' has the same structure as the IPD layer 36, such as for instance, an ONO structure.

In the second embodiment, the floating gate 34 is arranged at a space between the element isolation insulating layers 32. Further, the floating gate 35 is arranged on the floating gate 34, and the widths thereof in the both directions of the column direction and the row direction are narrower than those of the floating gate 34. Thus, like the first embodiment, it is possible to achieve miniaturization of the memory cell MC and increase of the coupling ratio.

Here, the second embodiment is different from the first embodiment in that the upper surface of the element isolation insulating layer 32 exists on the same position in height as the upper surface of the floating gate 34.

In this case, the space between the floating gates 34 is filled with only the element isolation insulating layer 32. As a result, the space between the floating gates 34 is filled with one kind of insulator.

Further, the control gate 37 is arranged at the space between the floating gates 35 via the dielectric material having higher dielectric constant than the dielectric constant of the one kind of the insulator between the floating gates 34.

Therefore, according to the second embodiment, like the first embodiment, even though the memory cell MC is miniaturized, there is no threshold fluctuation caused by the interference effect between cells, thus it is possible to improve the coupling ratio.

Further, in the second embodiment, the upper surface of the element isolation insulating layer 32 agrees with the upper surface of the floating gate 34. Therefore, the structure of the IPD layer 36 is not subjected to limitation.

Figure 16:
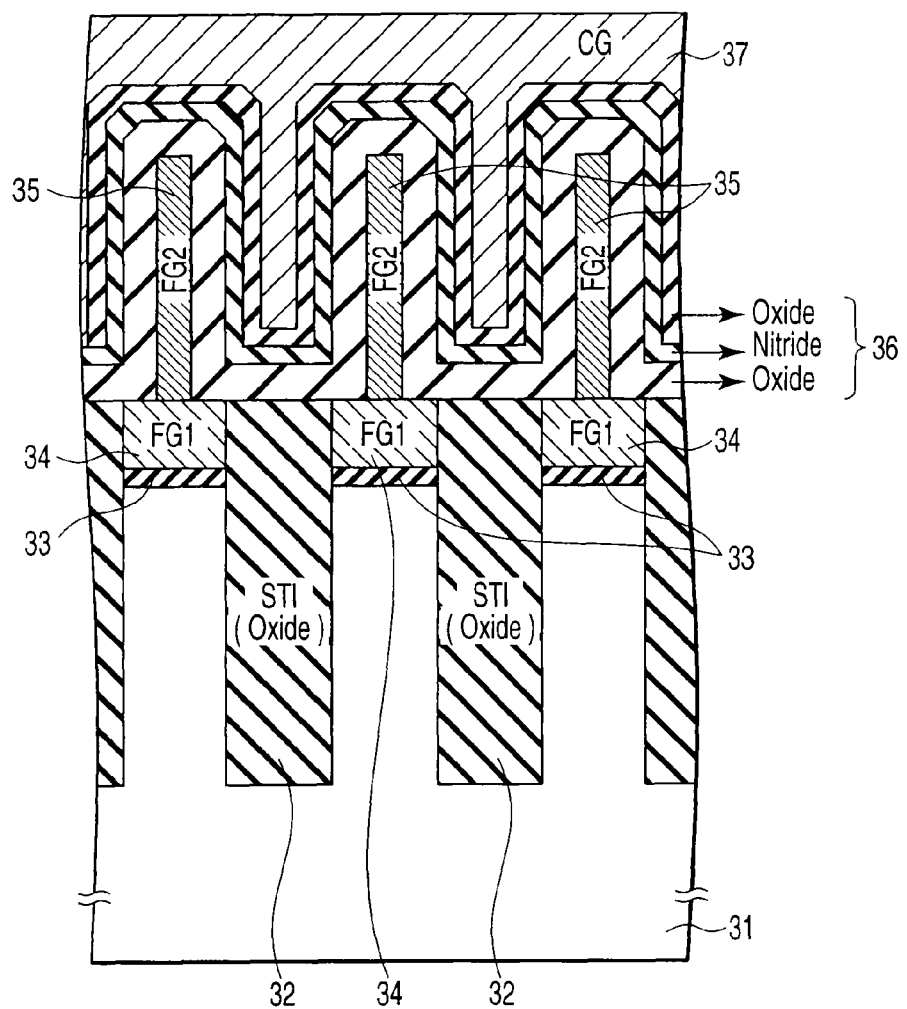
FIG. 16 is a cross-sectional view showing a NAND string of the second embodiment.
Figure 17:
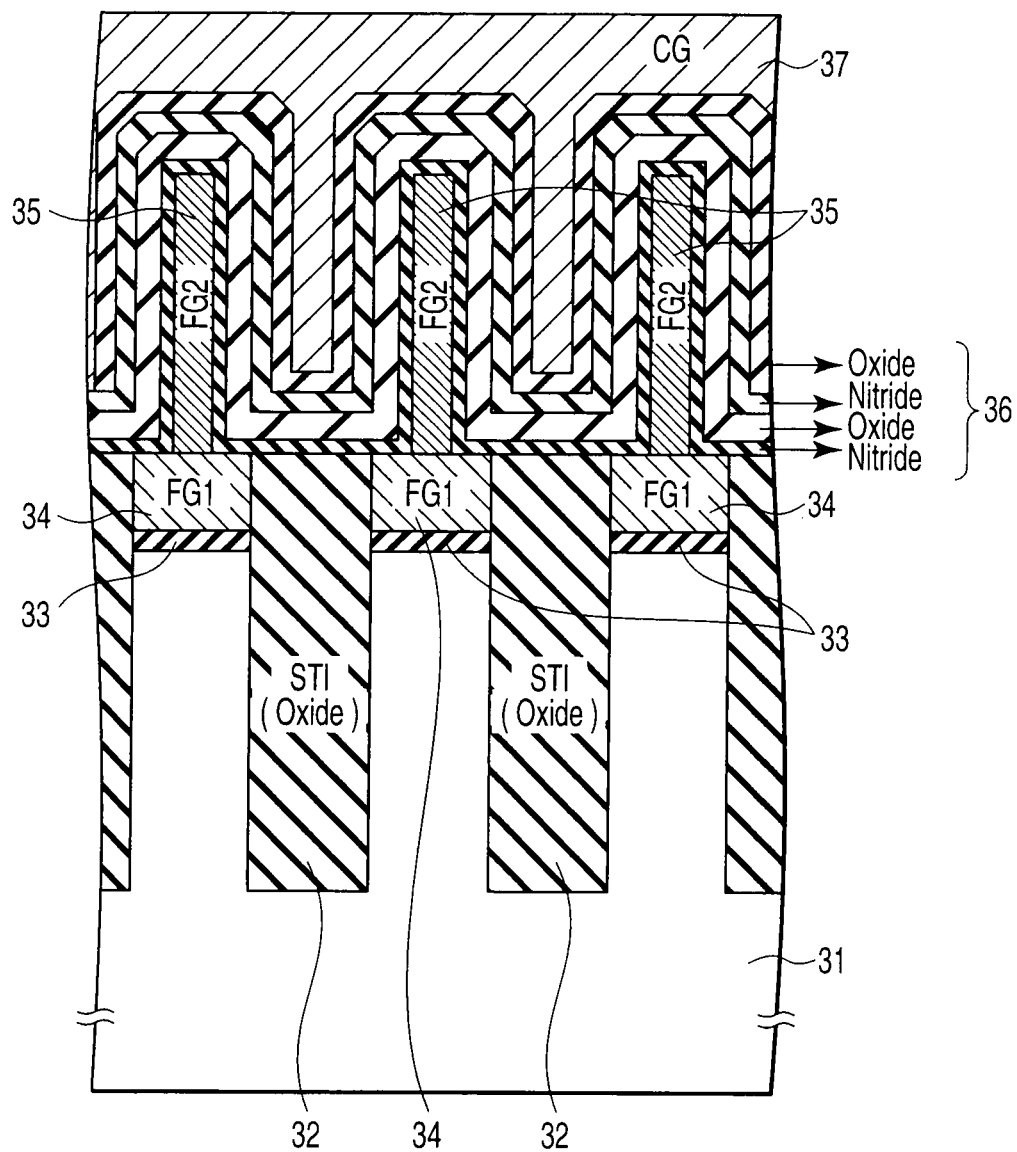
FIG. 17 is a cross-sectional view showing a NAND string of the second embodiment.
Figure 18:
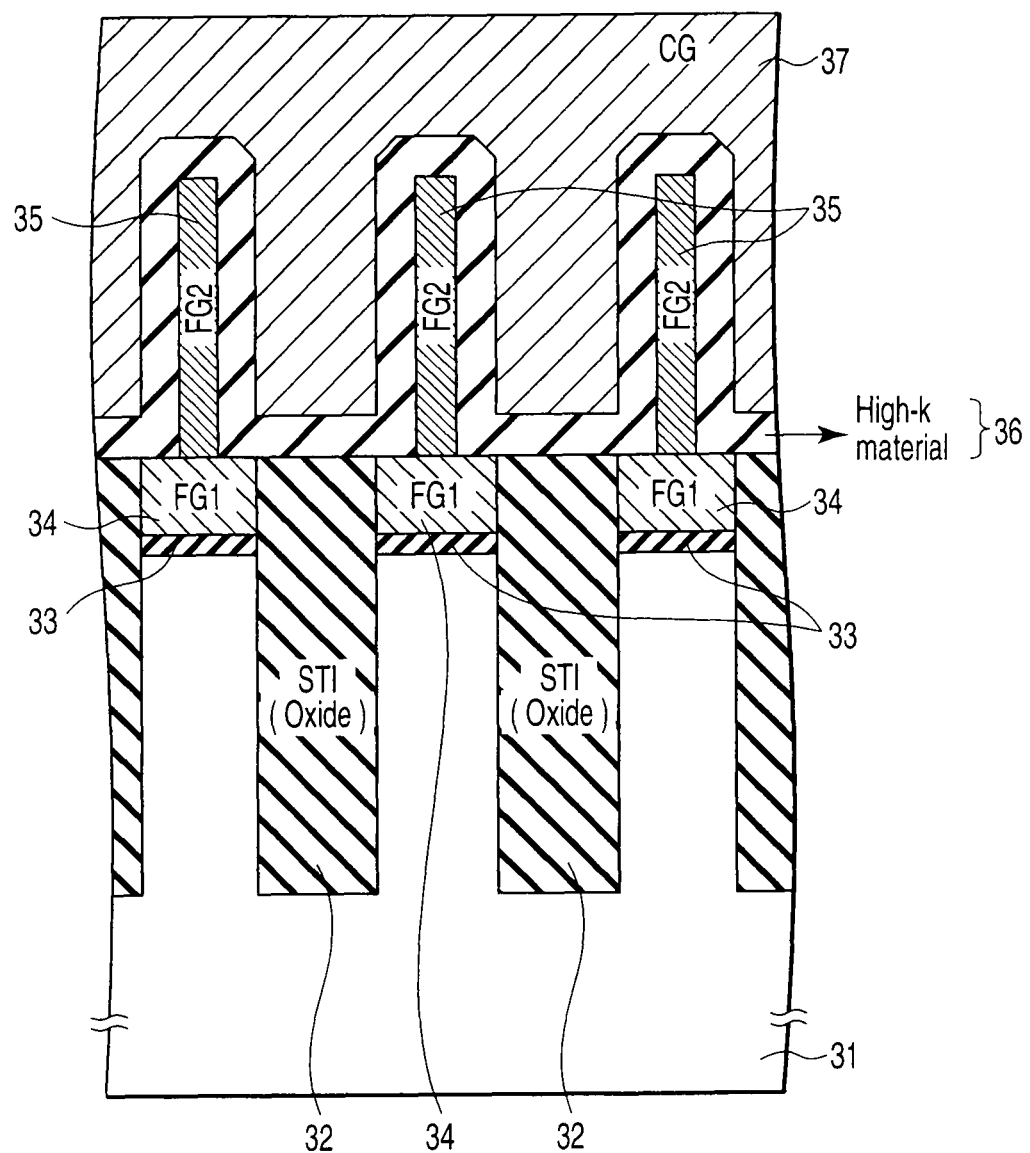
FIG. 18 is a cross-sectional view showing a NAND string of the second embodiment.

For instance, the IPD layer 36 may have the ONO structure as shown in FIG. 16, and the IPD layer 36 may have a NONO structure as shown in FIG. 17. Further, the IPD layer 36 may be constituted by a high-dielectric material (high-k material) of a single layer.

Further, the IPD layer 36 may be the stack structure of silicon oxide and silicon nitride such as the ON structure, the ONON structure, the NON structure, or the NONON structure.

Furthermore, the IPD layer 36 may be a NOAON (A is $Al_2O_3$).

Thus, also in the second embodiment, by making the floating gates 34, 35 protrusion, by filling the region where the floating gates 34, 35 are formed in closest proximity with each other with one kind of the insulator having a low dielectric constant, and by arranging the dielectric material having a high dielectric constant at another region, it is possible to obtain the same effect as the first embodiment.

(5) Third Embodiment

Figure 19:
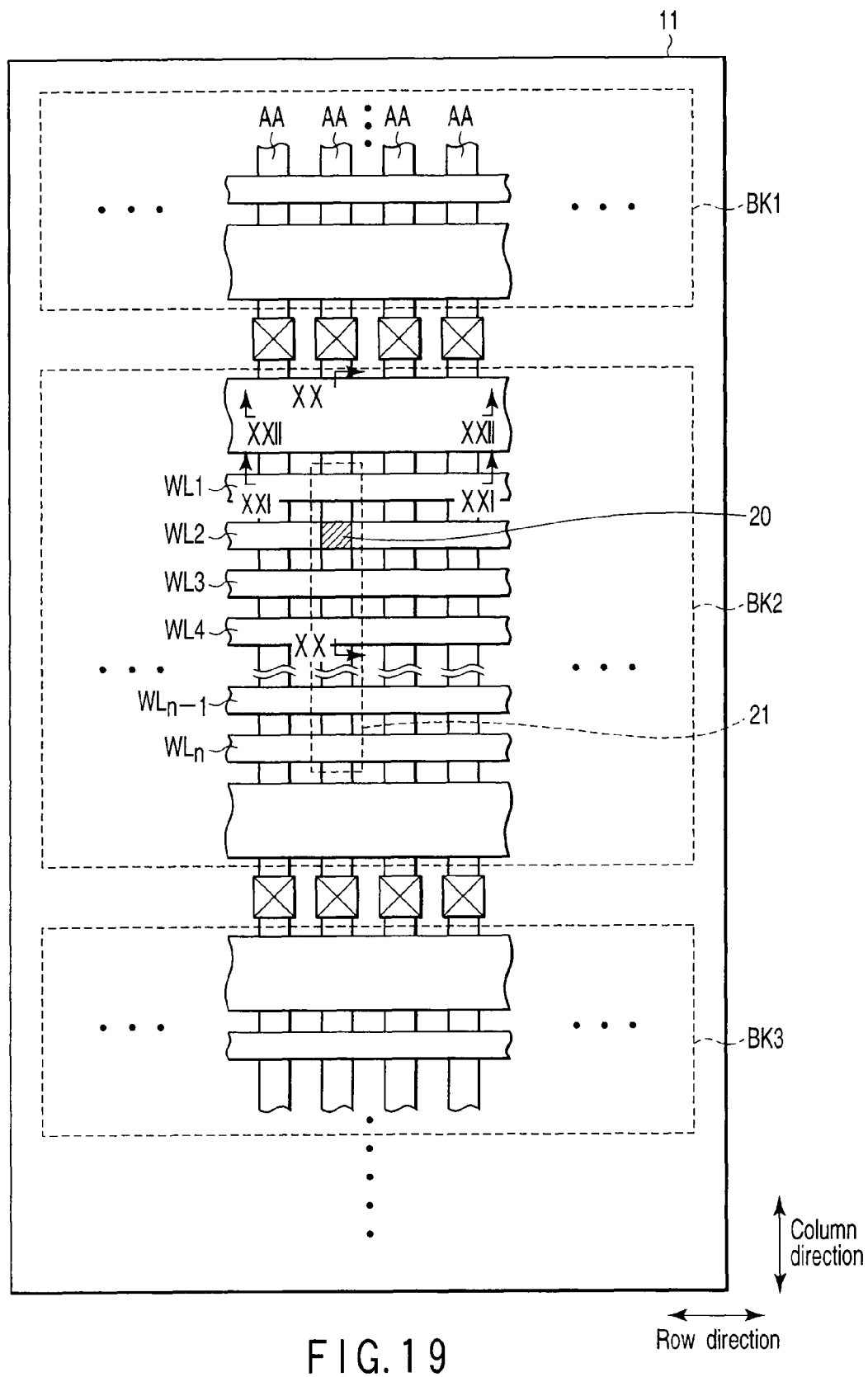
FIG. 19 is a plan view showing layout as a third embodiment.
Figure 20:
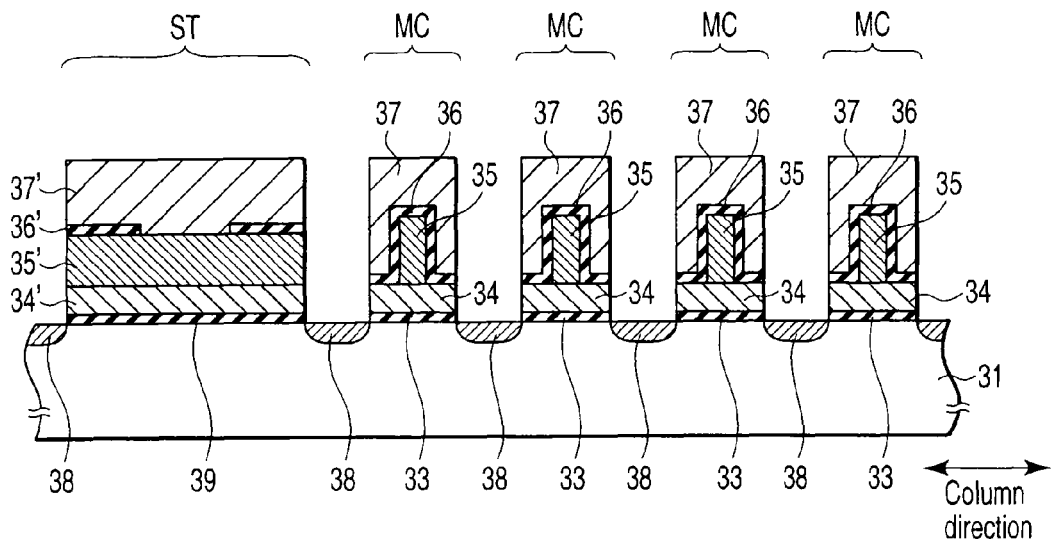
FIG. 20 is a cross-sectional view along a line XX-XX of FIG. 19.
Figure 21:
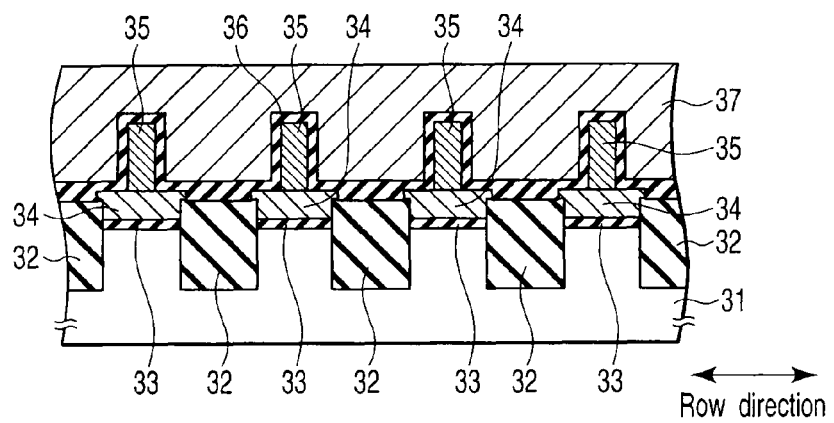
FIG. 21 is a cross-sectional view along a line XXI-XXI of FIG. 19.
Figure 22:
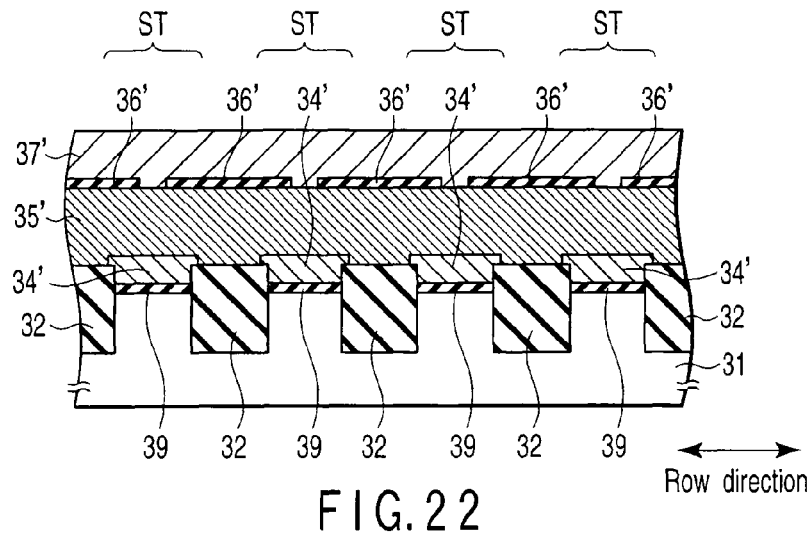
FIG. 22 is a cross-sectional view along a line XXII-XXII of FIG. 19.

FIG. 19 shows layout of a memory cell array of a NAND-type flash memory according to a third embodiment. FIG. 20 is a cross section along a line XX-XX of FIG. 19, FIG. 21 is a cross section along a line XXI-XXI of FIG. 19, and FIG. 22 shows a cross section along a line XXII-XXII of FIG. 19.

In these drawings, like the first embodiment, there are omitted the insulating layer and the conductive layer upper than the control gate. Further, explanation of the structure of the memory cell array 11 is omitted since it is the same structure as that of the first embodiment.

An element isolation insulating layer 32 with an STI structure is arranged within a semiconductor substrate 31. The element isolation insulating layer 32 is formed in a stripe shape long in the column direction, and a region therebetween becomes an active area AA. The cell unit is arranged in the active area AA.

The memory cell MC is comprised a source/drain diffusion layer 38 formed on a surface region of the semiconductor substrate 31, floating gates 34, 35 arranged via a tunnel oxide film 33 on the channel region between the source/drain diffusion layers 38, and a control gate 37 arranged via the IPD layer 36 on the floating gates 34, 35.

A select gate transistor ST is comprised a source/drain diffusion layer 38 formed on a surface region of the semiconductor substrate 31, and gate electrodes 34', 35', and 37' arranged via a gate oxide film 39 on a channel region between the source/drain diffusion layers 38.

The gate electrodes 34', 35' are formed of the same material as the floating gates 34, 35, such as for instance, conductive polysilicon, and the gate electrode 37' is formed of the same material as the control gate 37, such as for instance, a stack structure of conductive polysilicon and silicide. The insulating layer 36' has the same structure as the IPD layer 36, such as for instance, an ONO structure.

In the third embodiment, the floating gate 34 has a so-called gull-wing shape. That is, the width of the floating gate 34 in the row direction is wider than that of the element isolation insulating layer 32. Such shape can easily be obtained by performing patterning of the floating gate 34, after forming the element isolation insulating layer 32.

Further, the floating gate 35 is arranged on the floating gate 34. The widths of the floating gate 35 in the both directions of the column direction and the row direction are narrower than those of the floating gate 34. Thus, like the first embodiment, it is possible to achieve miniaturization of the memory cell MC and increase of the coupling ratio.

Here, in the third embodiment, the space between the floating gates 34 existing on the element isolation insulating layer 32 becomes the region where two memory cells MC adjacent to each other are formed in closest proximity.

Figure 23:
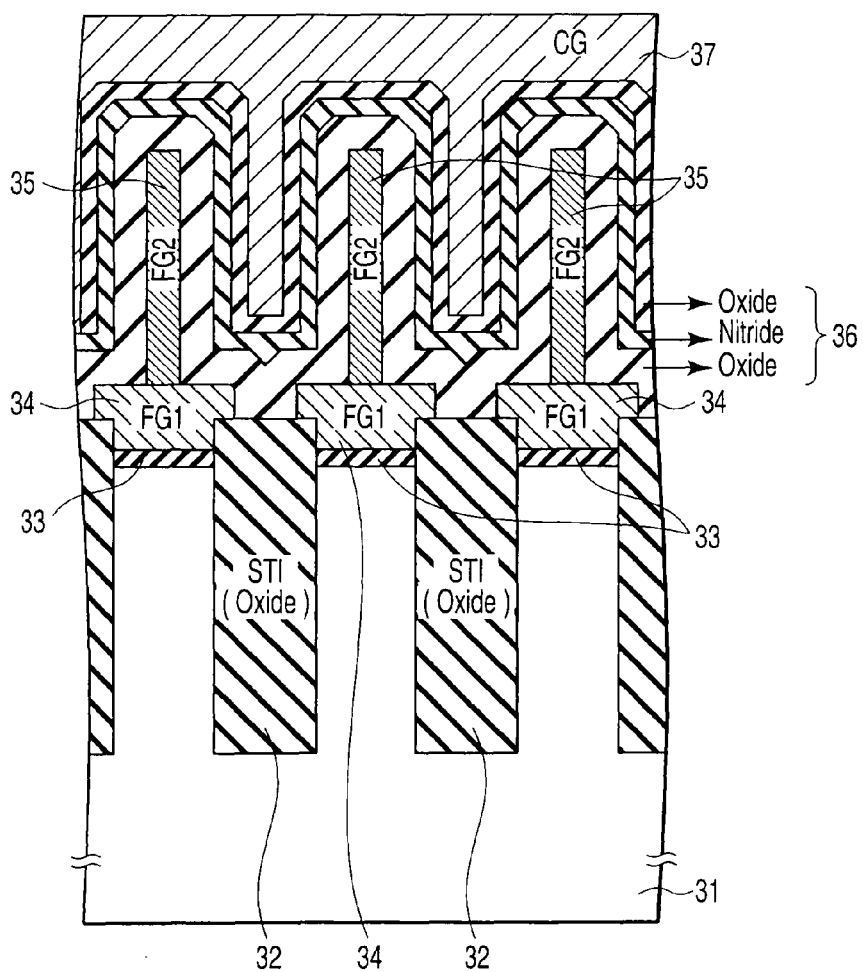
FIG. 23 is a cross-sectional view showing a NAND string of the third embodiment.

Accordingly, for instance, as shown in FIG. 23, the space between the floating gates 34 on the element isolation insulating layer 32 is filled with the same material (for instance, silicon oxide) as the material having the lowest dielectric constant among a plurality of materials with different dielectric constants constituting the IPD layer 36, that is, the material constituting the element isolation insulating layer 32.

As a result, the space between the floating gates 34 is filled with one kind of material.

Further, the control gate 37 is arranged at the space between the floating gates 35 via the dielectric material having higher dielectric constant than the dielectric constant of one kind of the insulator between the floating gates 34. The material of this dielectric material is silicon nitride ($Si_xN_y$), in the case where, for instance, the IPD layer 36 has an ONO structure.

Thus, also in the third embodiment, by making the floating gates 34, 35 protrusion, by filling the region where the floating gates 34, 35 are formed in closest proximity with each other with one kind of the insulator having a low dielectric constant, and by arranging the dielectric material having a high dielectric constant at another region, it is possible to improve the coupling ratio while suppressing the threshold fluctuation caused by interference effect of the cell even though the memory cell MC is miniaturized.

(6) Manufacturing Method

There will be described a method of manufacturing a non-volatile semiconductor memory according to an example of the present invention.

The following manufacturing method relates to a process for forming an element isolation insulating layer, after forming a lower part of a protrusion shaped floating gate, and the method is suitable for forming the structure of the above-described first and second embodiments.

Figure 24:
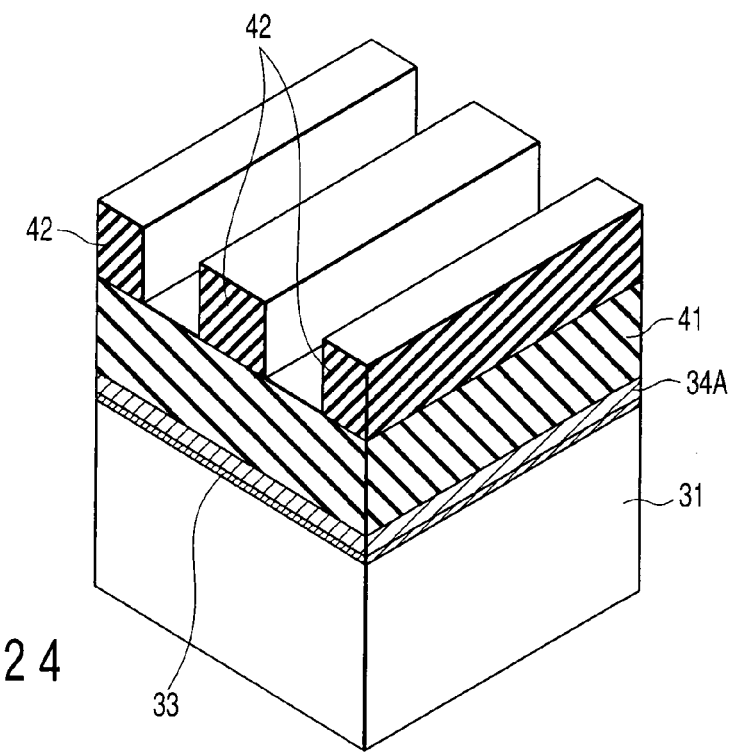
FIG. 24 is a perspective view showing one process of a manufacturing method according to an example of the present invention.

First, as shown in FIG. 24, a tunnel oxide film 33 is formed on a surface of a semiconductor substrate 31 by a thermal oxidation method. Continuously, a conductive polysilicon film 34A is formed on the tunnel oxide film 33 by the CVD method. Further, by the CVD method, a silicon nitride film 41 as a spacer is formed on the conductive polysilicon film 34A. Furthermore, a silicon oxide film 42 is formed on the silicon nitride film 41.

Then, a resist pattern is formed by photolithography (photoengraving process [PEP]), patterning of the silicon oxide film 42 is performed using the resist pattern as a mask, and the resultant pattern is subjected to hard masking. After that, the resist pattern is removed.

Figure 25:
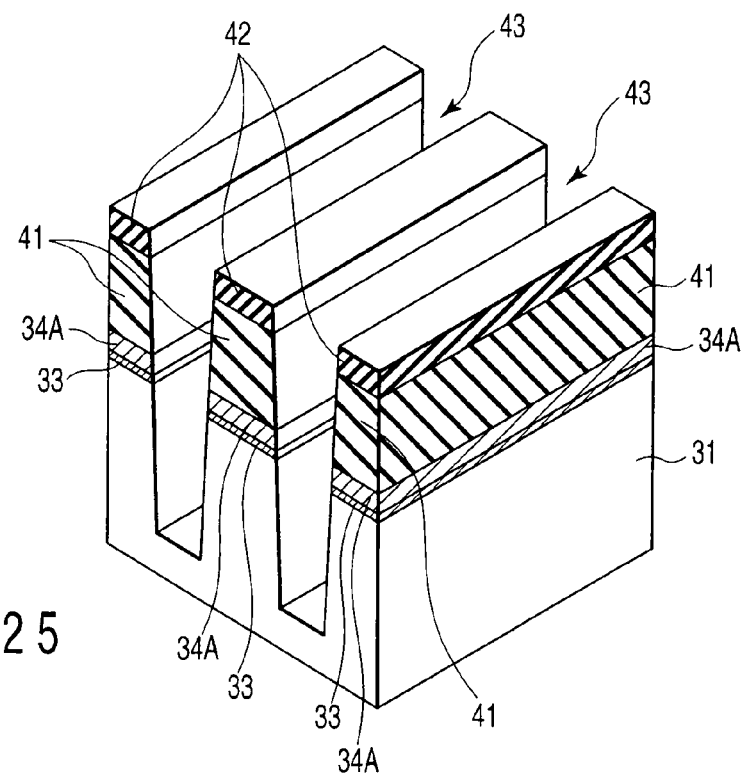
FIG. 25 is a perspective view showing one process of a manufacturing method according to the example of the present invention.

Next, as shown in FIG. 25, there are etched the silicon nitride film 41, the conductive polysilicon film 34A, the tunnel oxide film 33 and the semiconductor substrate 31 sequentially by, for instance, reactive ion etching (RIE) using the silicon oxide film 42 as the mask. As a result, a trench 43 with the stripe shape is formed.

Figure 26:
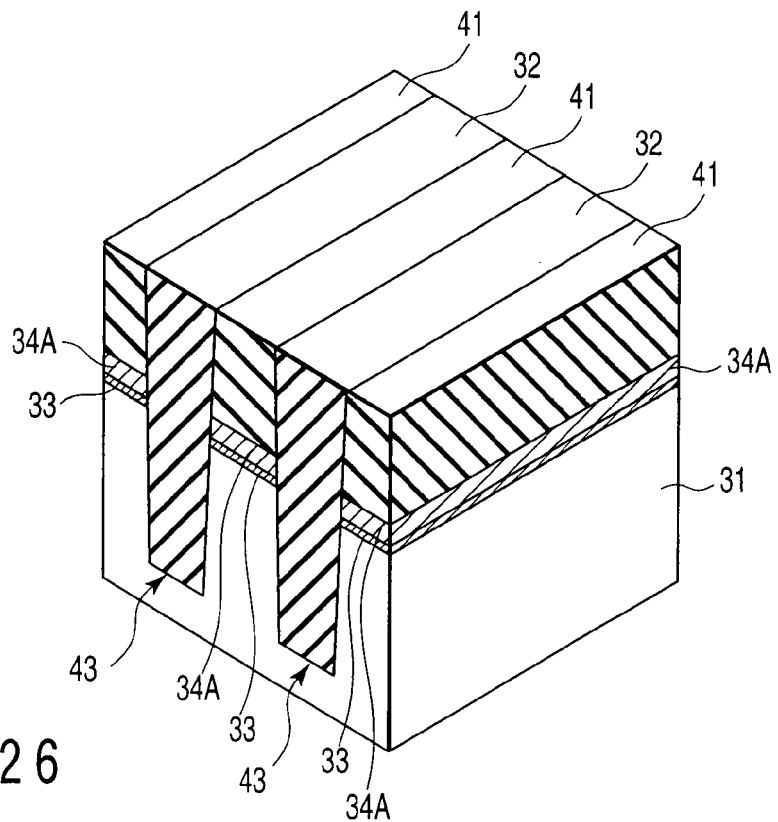
FIG. 26 is a perspective view showing one process of a manufacturing method according to the example of the present invention.

Next, as shown in FIG. 26, a silicon oxide film is formed by which the trench 43 is completely filled, by the CVD method. Further, an element isolation insulating layer 32 is formed inside the trench 43, while removing the silicon oxide film (including the silicon oxide film 42 of FIG. 25) existing at an external part of the trench 43 by the chemical mechanical polishing (CMP) method.

Figure 27:
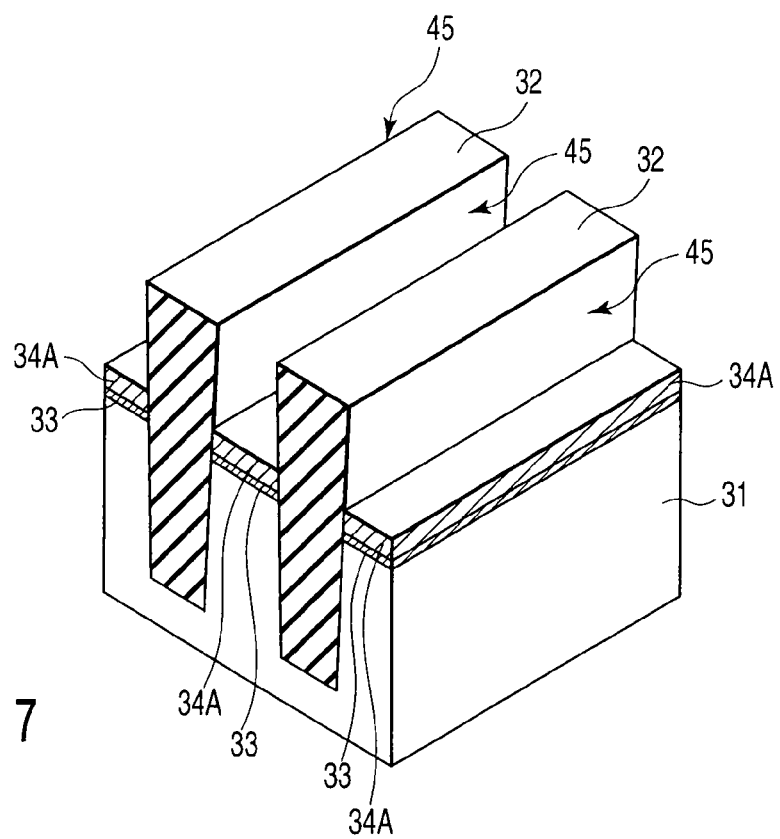
FIG. 27 is a perspective view showing one process of a manufacturing method according to the example of the present invention.

After that, when etching the silicon nitride film 41 by, for instance, hot phosphoric acid using the element isolation insulating layer 32 as the mask, as shown in FIG. 27, there is obtained a structure in which an upper part of the element isolation insulating layer 32 is protruded upper than the upper surface of the conductive polysilicon layer 34A.

Figure 28:
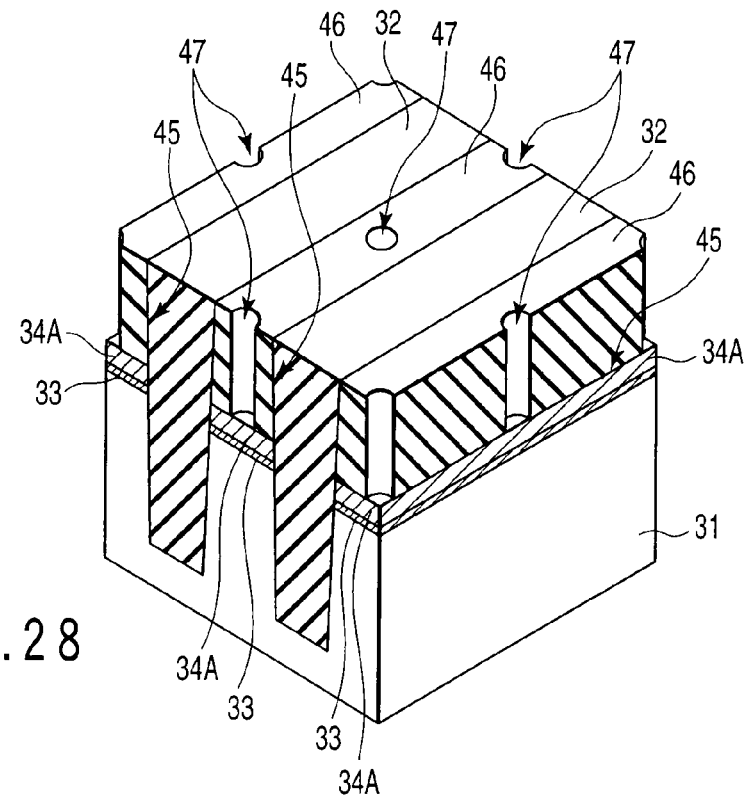
FIG. 28 is a perspective view showing one process of a manufacturing method according to the example of the present invention.

Next, as shown in FIG. 28, a silicon nitride film 46 is formed on the conductive polysilicon film 34A and on the element isolation insulating layer 32 by the CVD method. The silicon nitride film 46 is formed with a thickness by which a space 45 between the upper parts of the element isolation insulating layers 32 is filled completely.

After that, the upper surface of the silicon nitride film 46 is flattened while polishing the silicon nitride film 46 until the upper surface of the element isolation insulating layer 32 is exposed, by the CMP method.

Further, a resist pattern is formed by the photolithography (PEP), and a hole 47 reaching the conductive polysilicon film 34A is formed in the silicon nitride film 46, using the resist pattern as the mask. After that, the resist pattern is removed.

Figure 29:
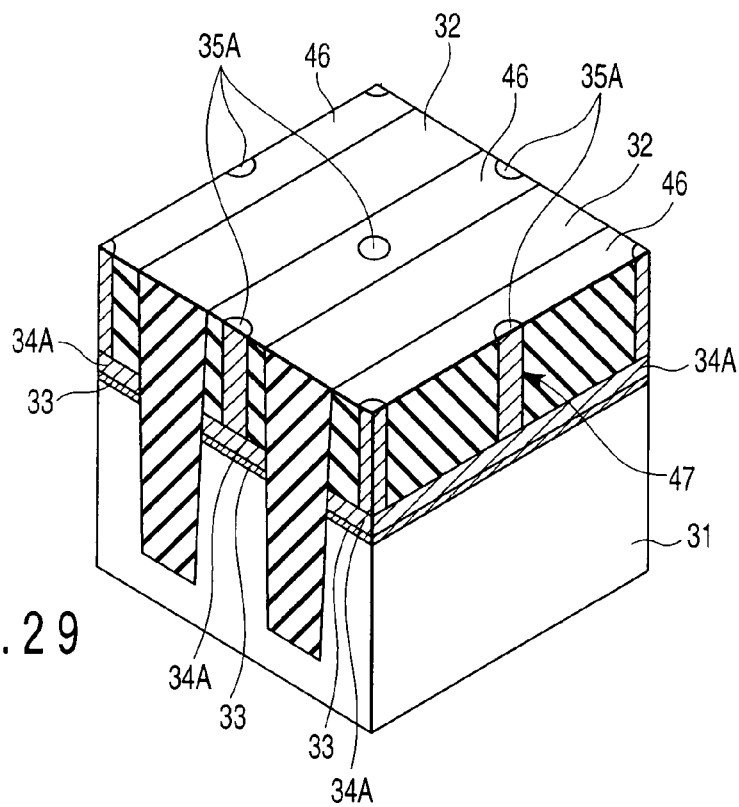
FIG. 29 is a perspective view showing one process of a manufacturing method according to the example of the present invention.

Next, as shown in FIG. 29, a conductive polysilicon film 35A is formed by the CVD method, and the hole 47 formed in the silicon nitride film 46 is completely filled with the conductive polysilicon film 35A. Further, the conductive polysilicon film 35A existing in an external part of the hole 47 is removed by the CMP method.

After that, when selectively etching only the element isolation insulating layer 32, as shown in FIG. 30, the upper surface of the element isolation insulating layer 32 retreats up to a position lower than the upper surface of the silicon nitride film 46.

Here, it is possible to obtain a structure of the first or second embodiment, by adjusting quantity of causing the upper surface of the element isolation insulating layer 32 to retreat.

Note that, in order to improve the coupling ratio of the memory cell to the maximum, it is preferable to cause the upper surface of the element isolation insulating layer 32 to retreat up to a position lower than the upper surface of the conductive polysilicon film 34A.

Continuously, the silicon nitride film 46 is removed by hot phosphoric acid.

Next, as shown in FIG. 31, the IPD layer 36 is formed by the CVD method to cover the conductive polysilicon films 34A, 35A. For instance, the IPD layer 36 has the ONO structure. Further, a conductive polysilicon film 37A is formed by the CVD method on the IPD layer 36.

After that, the resist pattern is formed by the photolithography (PEP), and sequentially etched are the conductive polysilicon film 37A, the IPD layer 36, the conductive polysilicon film 34A and the tunnel oxide film 33, using this resist pattern as the mask.

The resist pattern is formed in the stripe shape, and formed so as to cross the stripe of the trench 43 in FIG. 25.

As a result, as shown in FIG. 32, there is completed a structure in which the floating gates 34, 35, the IPD layer 36 and the control gate 37 are stacked via the tunnel oxide film 33 on the semiconductor substrate 31.

Here, since the floating gate 35 becomes a column shape, its upper surface and the whole side surfaces are covered by the control gate 37.

After that, when injecting impurities into the semiconductor substrate 11 in the self-alignment manner by ion implantation method using the control gate 37 as the mask, and performing annealing for activating the impurities, a source/drain diffusion layer 38 is formed.

Due to the above process, the structure of the memory cell according to the example of the present invention is completed.

After that, as shown in FIG. 33, an inter-layer insulating film (for instance, $SiO_2$) 48 which covers the control gate 37 and fills the space between the control gates 37 is formed by the CVD method.

Further, a contact hole is formed in a region to become one end of the NAND string, after flattening the upper surface of the inter-layer insulating film 48 by the CMP method. The conductive polysilicon film is formed by the CVD method, and further, a bit line 49 is formed by performing patterning of the conductive polysilicon film by the RIE method using the photoresist formed by the photolithography (PEP) as the mask.

Note that, the above-described manufacturing method relates to the structure of the first and second embodiments. However, the manufacturing method can be applied to the structure of the third embodiment by changing a sequence of formation of a lower part of the protrusion floating gate and formation of the element isolation insulating layer.

(7) Others

Concerning the first embodiment, it is possible to obtain an effect of the present invention even if the IPD film is formed such that a thin dielectric material with a high dielectric constant is arranged at a part coming into contact with the floating gate, as long as a large part between the floating gates is filled with the dielectric material with a low dielectric constant.

For instance, as the IPD film, the structure thereof may be NONON or NOAON (A is $Al_2O_3$). However, in this case, it may be preferably configured such that a large part between the floating gates is filled with oxide (O), and in the space between the floating gates, nitride (N) exists only at an interface between the IPD film and the floating gate.

The above described embodiments are explained with respect to the NAND-type flash memory. However, the examples of the present invention are can be applied to a general nonvolatile semiconductor memory provided with the memory cell of the stack gate structure having the floating gate and the control gate.

3. CONCLUSION

According to the examples of the present invention, by the new device structure, there is no threshold fluctuation caused by the interference effect between cells, thus it is possible to improve the coupling ratio.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
    first and second memory cells each having a stack gate structure provided with a floating gate, a control gate, and an insulator sandwiched between the floating gate and the control gate, and being adjacent to each other in an extending direction of the control gate,
    wherein each of the floating gates of the first and second memory cells comprises a first film, and a second film arranged on the first film, the second film having a width narrower than that of the first film in the extending direction of the control gate;
    the first film is arranged between element isolation insulating layers, each of the element isolation insulating layers having an upper surface lower than that of the first film;
    the insulator has a first layer arranged on the floating gate and a second layer arranged above the first layer, the second layer having a dielectric constant higher than dielectric constants of the first layer and the element isolation insulating layers;
    a first space between the first films of the first and second memory cells is filled with one of the element isolation insulating layers and only the first layer of the insulator arranged on the one of the element isolation insulating layers; and
    a second space between the second films of the first and second memory cells includes the first layer and the second layer.

2. The nonvolatile semiconductor memory according to claim 1,
    wherein an upper part of the first space is filled with the first layer having a lowest dielectric constant of dielectric constants of layers included in the insulator.

3. The nonvolatile semiconductor memory according to claim 1,
    wherein the element isolation insulating layers and the first layer are made of the same material.

4. The nonvolatile semiconductor memory according to claim 1,
    wherein the insulator has a third layer arranged above the second layer.

5. The nonvolatile semiconductor memory according to claim 4,
wherein the first layer is oxide, the second layer is nitride, and the third layer is oxide.

6. The nonvolatile semiconductor memory according to claim 1,
wherein the first layer is oxide.

7. The nonvolatile semiconductor memory according to claim 1,
wherein the first layer is oxide and the second layer is nitride.

8. The nonvolatile semiconductor memory according to claim 1,
wherein the element isolation insulating layers are oxide.

9. The nonvolatile semiconductor memory according to claim 1,
wherein the second film has a width narrower than that of the first film in an orthogonal direction with respect to the extending direction of the control gate.

10. The nonvolatile semiconductor memory according to claim 1,
wherein each of the first and second memory cells constitutes part of a NAND string.

11. A nonvolatile semiconductor memory comprising:
first and second memory cells each having a stack gate structure provided with a floating gate and a control gate, and being adjacent to each other in an extending direction of the control gate,
wherein each of the floating gates of the first and second memory cells comprises a first film, and a second film arranged on the first film, the second film having a width narrower than that of the first film in the extending direction of the control gate;
the first film is arranged between element isolation insulating layers, each of the element isolation insulating layers having an upper surface lower than that of the first film;
a first space between the first films of the first and second memory cells is completely filled with only one of the element isolation insulating layers and a first dielectric material arranged on the one of the element isolation insulating layers; and
the control gate is arranged at a second space between the second films of the first and second memory cells via a second dielectric material having a dielectric constant higher than dielectric constants of the element isolation insulating layers and the first dielectric material.

12. The nonvolatile semiconductor memory according to claim 11,
wherein the element isolation insulating layers and the first dielectric material are made of the same material.

13. The nonvolatile semiconductor memory according to claim 11,
wherein the element isolation insulating layers and the first dielectric material are made of oxide.

14. The nonvolatile semiconductor memory according to claim 11,
wherein the element isolation insulating layers are made of oxide.

15. The nonvolatile semiconductor memory according to claim 11,
wherein the second dielectric material includes nitride.

16. The nonvolatile semiconductor memory according to claim 11,
wherein the second dielectric material is made of oxide and nitride.

17. The nonvolatile semiconductor memory according to claim 11,
wherein the first dielectric material includes oxide and the second dielectric material includes nitride.

18. The nonvolatile semiconductor memory according to claim 17,
wherein the second film has a width narrower than that of the first film in an orthogonal direction with respect to the extending direction of the control gate.

19. The nonvolatile semiconductor memory according to claim 11,
wherein the second film has a width narrower than that of the first film in an orthogonal direction with respect to the extending direction of the control gate.

20. The nonvolatile semiconductor memory according to claim 11,
wherein each of the first and second memory cells constitutes part of a NAND string.

* * * * *